(12) United States Patent
Lee et al.

(10) Patent No.: US 12,268,001 B2
(45) Date of Patent: Apr. 1, 2025

(54) NONVOLATILE MEMORY DEVICE

(71) Applicant: Samsung Electronics Co., Ltd., Suwon-si (KR)

(72) Inventors: Jung-Hwan Lee, Seoul (KR); Hyun Min Cho, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 512 days.

(21) Appl. No.: 17/736,384

(22) Filed: May 4, 2022

(65) Prior Publication Data

US 2023/0005954 A1 Jan. 5, 2023

(30) Foreign Application Priority Data

Jul. 5, 2021 (KR) ........................ 10-2021-0087878

(51) Int. Cl.
*H10B 43/27* (2023.01)
*H10B 43/10* (2023.01)
*H10B 43/30* (2023.01)

(52) U.S. Cl.
CPC ............. *H10B 43/27* (2023.02); *H10B 43/10* (2023.02); *H10B 43/30* (2023.02)

(58) Field of Classification Search
CPC ......... H10B 43/27; H10B 43/10; H10B 43/30
See application file for complete search history.

(56) References Cited

U.S. PATENT DOCUMENTS

| | | | |
|---|---|---|---|
| 9,543,022 B2 | 1/2017 | Hashimoto et al. | |
| 9,812,462 B1 | 11/2017 | Pang et al. | |
| 9,922,992 B1* | 3/2018 | Yu | H01L 29/0649 |
| 10,734,396 B2* | 8/2020 | Kang | H10B 43/27 |
| 10,790,358 B2 | 9/2020 | Choi et al. | |
| 10,804,283 B2 | 10/2020 | He et al. | |
| 10,823,683 B1 | 11/2020 | Nie et al. | |
| 2016/0284410 A1* | 9/2016 | Lee | G11C 16/0483 |
| 2020/0395374 A1 | 12/2020 | Huo et al. | |
| 2023/0011135 A1* | 1/2023 | Hopkins | H01L 29/42328 |

FOREIGN PATENT DOCUMENTS

KR 10-2007-0014727 A 2/2007

* cited by examiner

*Primary Examiner* — David Vu
*Assistant Examiner* — Brandon C Fox
(74) *Attorney, Agent, or Firm* — Harness, Dickey & Pierce, P.L.C.

(57) ABSTRACT

A nonvolatile memory device with improved reliability is provided. The nonvolatile memory device comprises a substrate, a mold structure including a plurality of word lines stacked on the substrate, a first word line cut region configured to cut the mold structure, a first channel structure spaced apart from the first word line cut region by a first distance, and disposed in the mold structure and the substrate, and a second channel structure spaced apart from the first word line cut region by a second distance, and disposed in the mold structure and the substrate, wherein the second distance is greater than the first distance, a first width of the first channel structure is different from a second width of the second channel structure, and a first length of the first channel structure is different from a second length of the second channel structure.

20 Claims, 23 Drawing Sheets

NONVOLATILE MEMORY DEVICE

CROSS-REFERENCE TO RELATED APPLICATION

This application claims priority from Korean Patent Application No. 10-2021-0087878 filed on Jul. 5, 2021 in the Korean Intellectual Property Office, and all the benefits accruing therefrom under 35 U.S.C. 119, the contents of which in its entirety are herein incorporated by reference.

BACKGROUND

Some example embodiments relate to a nonvolatile memory device.

Semiconductor memory devices include volatile memory devices and nonvolatile memory devices. The volatile memory devices may lose stored contents when powered off, while nonetheless having high read and/or write speeds. Conversely, since the nonvolatile memory devices retain their stored contents even when powered off, the nonvolatile memory devices are used to store contents that need to be or are desired to be maintained regardless of whether power is supplied or not.

For example, the volatile memory device includes a static RAM (SRAM), a dynamic RAM (DRAM), a synchronous DRAM (SDRAM), and/or the like. The nonvolatile memory devices retain their stored contents even when powered off. For example, the nonvolatile memory devices include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), and/or the like. Flash memories may be classified into NOR flash memory and NAND flash memory.

In particular, a flash memory device has an advantage of being able to be implemented as, for example, a highly integrated auxiliary mass storage device when compared to a general EEPROM.

The flash memory device may include a plurality of flash memories. The plurality of flash memories may be mounted on a package substrate, and a chip pad of each flash memory may be connected to the package substrate via a connector.

The flash memory device may be fabricated by exposure (e.g. photolithographic exposure) and etching (e.g. wet and/or dry etching) processes. When a channel structure of the flash memory device is made, a trench may be formed by the etching process. In this case, a problem may occur that the trench is not formed by the etching process due to an influence of a mask formed in a word line cut region.

SUMMARY

Some example embodiments a nonvolatile memory device with improved reliability.

Alternatively or additionally, some example embodiments may also provide a method for fabricating a nonvolatile memory device with improved reliability.

However, example embodiments are not restricted to those set forth herein. The above and other aspects of example embodiments will become more apparent to one of ordinary skill in the art to which inventive concepts pertains by referencing the detailed description given below.

According to some example embodiments, a nonvolatile memory device comprises a substrate, a mold structure including a plurality of word lines stacked on the substrate, a first word line cut region cutting the mold structure, a first channel structure spaced apart from the first word line cut region by a first distance and in the mold structure and the substrate, and a second channel structure spaced apart from the first word line cut region by a second distance, and in the mold structure and the substrate. The second distance is greater than the first distance, a first width of the first channel structure is different from a second width of the second channel structure, and a first length of the first channel structure is different from a second length of the second channel structure.

According to some example embodiments, a nonvolatile memory device comprises a substrate, a mold structure including a plurality of word lines stacked on the substrate, a first word line cut region configured to cut the mold structure, a second word line cut region spaced apart from the first word line cut region in a first direction and configured to cut the mold structure, a first channel structure spaced apart from the first word line cut region by a first distance, and in the mold structure and the substrate, and a second channel structure spaced apart from the second word line cut region by a second distance greater than the first distance and in the mold structure and the substrate. A first width of the first channel structure is different from a second width of the second channel structure, and a first length of the first channel structure is different from a second length of the second channel structure.

According to some example embodiments, a nonvolatile memory device comprises a substrate, a mold structure including a plurality of word lines stacked on the substrate, a first word line cut region configured to cut the mold structure, a second word line cut region spaced apart from the first word line cut region in a first direction and configured to cut the mold structure, a first channel structure spaced apart from the first word line cut region by a first distance, and disposed in the mold structure and the substrate, a second channel structure spaced apart from the first word line cut region by a second distance greater than the first distance, and disposed in the mold structure and the substrate, and a third channel structure spaced apart from the first word line cut region by a third distance greater than the second distance, and disposed in the mold structure and the substrate, wherein a first length of the first channel structure is different from a second length of the second channel structure and a third length of the third channel structure.

According to an some example embodiments, a method for fabricating a nonvolatile memory device comprises alternately stacking an insulating pattern and a sacrificial layer on a substrate, the insulating pattern and the sacrificial layer including cell regions and different word line cut regions, forming a mask on the insulating pattern of the word line cut region, forming a first trench and a second trench by performing low-temperature etching on the insulating pattern, the sacrificial layer, and the substrate of the cell region, filling the first trench to form a first channel structure, filling the second trench to form a second channel structure, removing the mask on the insulating pattern of the word line cut region, and performing etching on the word line cut region to form a third trench. A first depth of the first trench is different from a second depth of the second trench, a width of a hole exposed to the insulating pattern of the first trench is different from a width of a hole exposed to the insulating pattern of the second trench, and the low-temperature etching is performed at a temperature below zero degrees Celsius.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EXAMPLE EMBODIMENTS

Hereinafter, some example embodiments according to the technical spirit of inventive concepts will be described with reference to the accompanying drawings.

Figure 1:
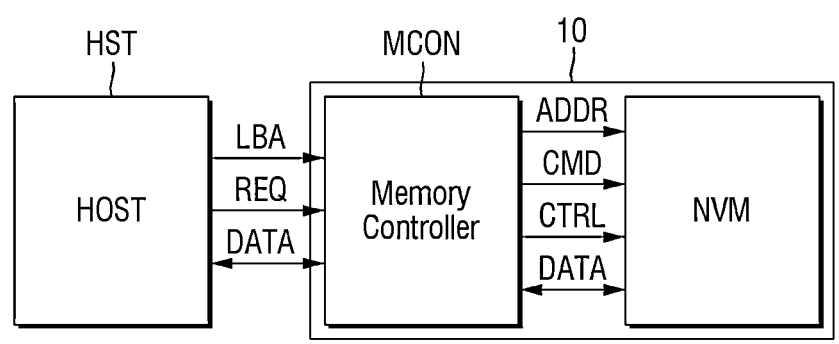
FIG. 1 is a block diagram illustrating an electronic device according to some example embodiments.
Figure 2:
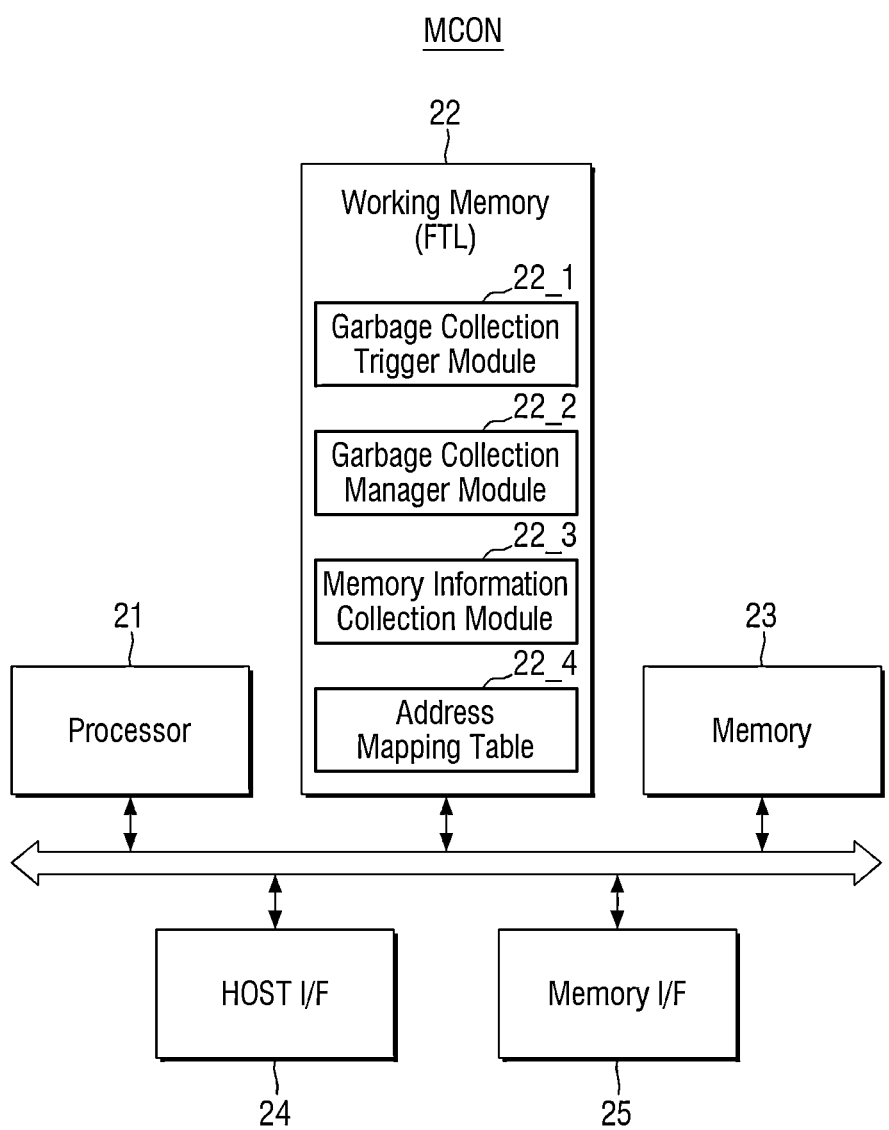
FIG. 2 is a block diagram illustrating a memory controller of FIG. 1.
Figure 3:
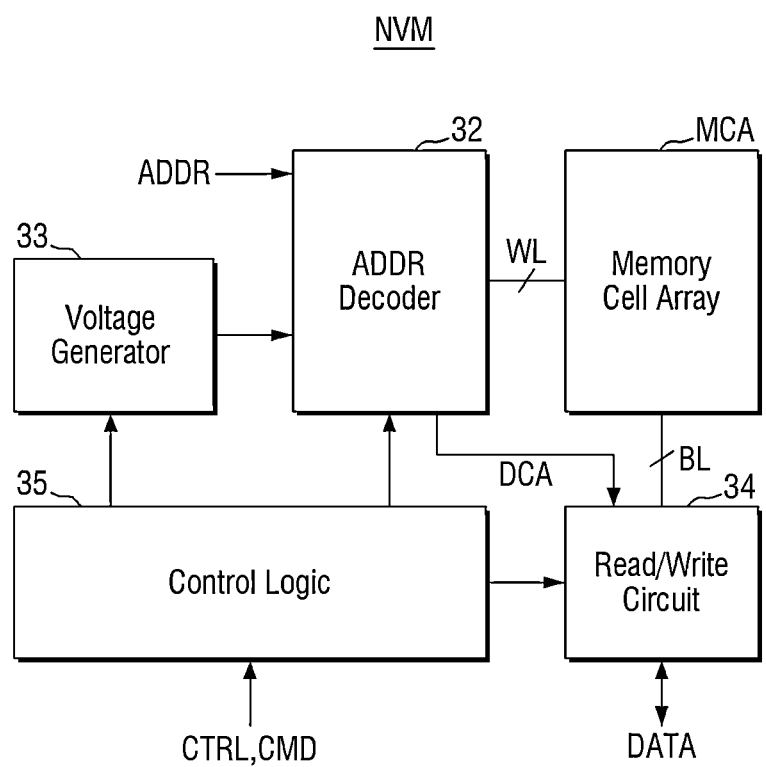
FIG. 3 is a block diagram illustrating a nonvolatile memory of FIG. 1.

FIG. 1 is a block diagram illustrating an electronic device according to some example embodiments. FIG. 2 is a block diagram illustrating a memory controller of FIG. 1. FIG. 3 is a block diagram illustrating a nonvolatile memory of FIG. 1.

Referring to FIG. 1, an electronic device 1 may include a host HST and a memory storage device 10. The host HST and the memory storage device 10 may be electrically connected (e.g. wirelessly and/or wired connected). The host HST may provide a logical block address LBA and a request signal REQ to the memory storage device 10, and exchange data DATA with the memory storage device 10. For example, the host HST may be connected to a memory controller MCON.

The host HST may include, for example, a personal computer (PC), a laptop, a mobile phone, a smart phone, a tablet PC, and/or the like.

The memory storage device 10 may include the memory controller MCON and a nonvolatile memory NVM. The memory storage device 10 may be integrated into one semiconductor device. For example, the memory storage device 10 may include one or more of an embedded universal flash storage (UFS) memory device, an embedded multi-media card (eMMC), a solid state drive (SSD), or the like. Alternatively or additionally, for example, the memory storage device 10 may include one or more of a removable UFS memory card, a compact flash (CF) card, a secure digital (SD) card, a micro-SD card, a mini-SD card, an extreme digital (xD) card, a memory stick, or the like.

The nonvolatile memory NVM may include a NAND flash memory. However, example embodiments according to the technical spirit of inventive concepts are not limited thereto, and the nonvolatile memory NVM may include one or more of a NOR flash memory, or a phase-change RAM (PRAM), a magneto resistive RAM (MRAM), a resistive memory such as a ferroelectric RAM (FeRAM) and a resistive RAM (RRAM).

The memory controller MCON may be connected to the nonvolatile memory NVM to control the nonvolatile memory NVM. For example, in response to the logical block address LBA, the request signal REQ, and/or the like received from the host HST, the memory controller MCON may provide an address ADDR, a command CMD, a control signal CTRL, and/or the like to the nonvolatile memory NVM. The memory controller MCON may provide signals to the nonvolatile memory NVM to control writing or reading of data to or from the nonvolatile memory NVM. Alternatively or additionally, the memory controller MCON and the nonvolatile memory NVM may exchange data DATA.

Referring to FIG. 2, the memory controller MCON may include one or more of a processor 21, a working memory 22, a memory 23, a host interface 24, and a memory interface 25.

The processor 21 may include one or more of a central processing unit (CPU), a controller, an application specific integrated circuit (ASIC), or the like. The processor 21 may control the overall operation of the memory controller MCON. The processor 21 may control the memory controller MCON by driving firmware loaded in the working memory 22.

The memory 23 may store code data required for or used during initial booting of the memory storage device 10.

The memory controller MCON and the host HST may be connected through the host interface 24. the data DATA may be transmitted and/or received through the host interface 24. The host interface 24 may include one or more of an advanced technology attachment (ATA), a serial ATA (SATA), an external SATA (e-SATA), a universal serial bus (USB), or the like.

The memory controller MCON and the nonvolatile memory NVM may be connected through the memory interface 25. The data DATA, the control signal CTRL, the address ADDR, the command CMD, and/or the like may be transmitted and received through the memory interface 25. The working memory 22 may be implemented as one or more of a cache memory, a DRAM, a SRAM, a flash memory, or the like.

The working memory 22 may include a flash transition layer (FTL). The flash transition layer may include system software that manages write, read, and erase operations and the like of the nonvolatile memory NVM. For example, the flash transition layer may include firmware. The flash transition layer may be loaded into the working memory 22. The firmware of the flash transition layer may be executed by the processor 21.

The working memory 22 may include one or more of a garbage collection trigger module 22_1, a garbage collection manager module 22_2, a memory information collection module 22_3, and an address mapping table 22_4.

The working memory 22 may convert the logical block address LBA into the address ADDR using the address mapping table 22_4 and provide the logical block address LBA to the nonvolatile memory NVM. The working memory 22 may perform management on memory cells of the nonvolatile memory NVM. For example, the working memory 22 may perform garbage collection and bad block management operations on blocks of a memory cell array MCA of the nonvolatile memory NVM.

Referring to FIG. 3, the nonvolatile memory NVM may include the memory cell array MCA, an address decoder 32, a voltage generator 33, a read/write circuit 34, a control logic circuit 35, and the like.

The memory cell array MCA may be connected to the address decoder 32 through word lines WL. The memory cell array MCA may be connected to the read/write circuit 34 through bit lines BL. The memory cell array MCA may include a plurality of memory cells. For example, the memory cells arranged in a row direction may be connected to the word line WL. For example, the memory cells arranged in a column direction may be connected to the bit line BL. A number of word lines WL may be the same as, greater than, or less than a number of bit lines BL.

The address decoder 32 may be connected to the memory cell array MCA through the word lines WL. The address decoder 32 may operate under the control of the control logic circuit 35. The address decoder 32 may receive the address ADDR from the memory controller MCON. The address decoder 32 may receive from the voltage generator 33 a voltage required for an operation such as program or read.

The address decoder 32 may decode a row address among the received addresses ADDR. The address decoder 32 may select the word line WL using the decoded row address. A decoded column address DCA may be provided to the read/write circuit 34. For example, the address decoder 32 may include a row decoder, a column decoder, an address buffer, and the like.

The voltage generator 33 may generate a voltage required for or used during an access operation under the control of the control logic circuit 35. For example, the voltage generator 33 may generate a program voltage and a program verification voltage which are required to or used to perform a program operation. For example, the voltage generator 33 may generate read voltages required to perform a read operation, and generate an erase voltage and an erase verification voltage required to or used to perform an erase operation. Alternatively or additionally, the voltage generator 33 may provide a voltage required to perform each operation to the address decoder 32.

The read/write circuit 34 may be connected to the memory cell array MCA through the bit lines BL. The read/write circuit 34 may exchange the data DATA with the memory controller MCON. The read/write circuit 34 may operate under the control of the control logic circuit 35. The read/write circuit 34 may receive the decoded column address DCA from the address decoder 32. The read/write circuit 34 may select the bit line BL using the decoded column address DCA.

For example, the read/write circuit 34 may program the received data DATA into the memory cell array MCA. The read/write circuit 34 may read data from the memory cell array MCA and provide the read data to the outside (e.g., the memory controller MCON). For example, the read/write circuit 34 may include components such as one or more of a sense amplifier, a write driver, a column select circuit, a page buffer, and the like. The read/write circuit 34 may buffer the data DATA received from the memory controller MCON in a page buffer, and program the buffered data DATA into the memory cell array MCA.

The control logic circuit 35 may be connected to the address decoder 32, the voltage generator 33, and the read/write circuit 34. The control logic circuit 35 may control the operation of the nonvolatile memory NVM. The control logic circuit 35 may operate in response to the control signal CRTL and the command CMD (e.g., write command and/or read command) provided from the memory controller MCON.

Figure 4:
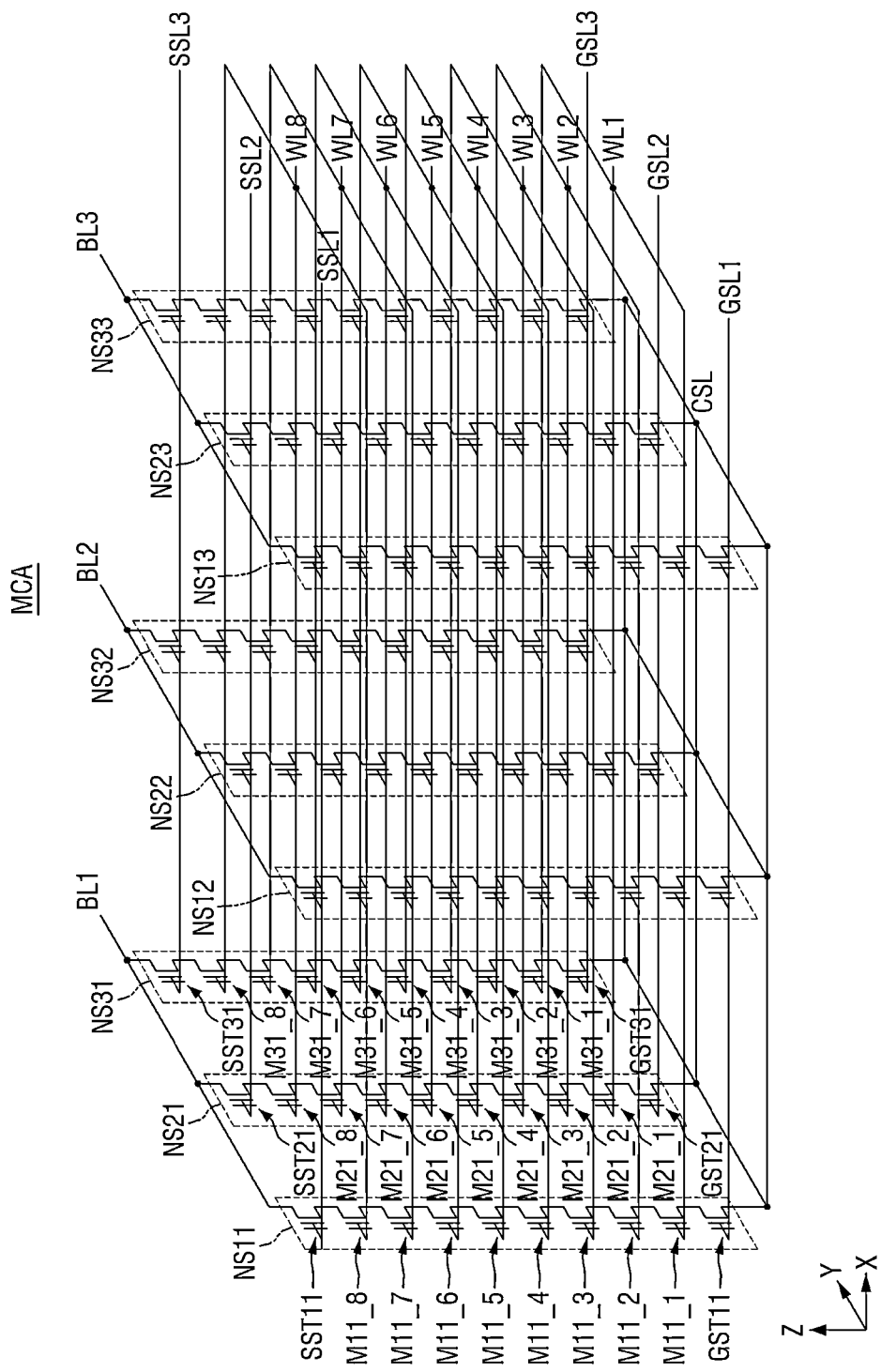
FIG. 4 is an example circuit diagram illustrating a memory cell array according to some example embodiments.

FIG. 4 is an example circuit diagram illustrating a memory cell array according to some example embodiments.

Referring to FIG. 4, a plurality of cell strings NS11, NS21, NS31, NS12, NS22, NS32, NS13, NS23, and NS33 may be arranged in a first direction x and a second direction y on a substrate (not shown). The plurality of cell strings NS11, NS21, NS31, NS12, NS22, NS32, NS13, NS23, and NS33 may have a shape extending in a third direction z. The plurality of cell strings NS11, NS21, NS31, NS12, NS22, NS32, NS13, NS23, and NS33 may be connected in common to a common source line CSL formed on or in the substrate (not shown). The common source line CSL is shown as being connected to the lowermost end of the plurality of cell strings NS11, NS21, NS31, NS12, NS22, NS32, NS13, NS23, and NS33 in the third direction z. However, it may be sufficient that the common source line CSL is electrically connected to the lowermost end of the plurality of cell strings NS11, NS21, NS31, NS12, NS22, NS32, NS13, NS23, and NS33 in the third direction z, and the common source line CSL is not limited to being physically located at the lower end of the plurality of cell strings NS11, NS21, NS31, NS12, NS22, NS32, NS13, NS23, and NS33. Alternatively or additionally, the plurality of cell strings NS11, NS21, NS31, NS12, NS22, NS32, NS13, NS23, and NS33 are shown to be arranged in a 3×3 array in this drawing, but the arrangement shape and/or the number of the plurality of cell strings arranged in the memory cell array MCA are not limited thereto.

Some of the cell strings NS11, NS12, and NS13 may be connected to a first ground select line GSL1. Some of the cell strings NS21, NS22, and NS23 may be connected to a second ground select line GSL2. Some of the cell strings NS31, NS32, and NS33 may be connected to a third ground select line GSL3.

Alternatively or additionally, some of the cell strings NS11, NS12, and NS13 may be connected to a first string select line SSL1. Some of the cell strings NS21, NS22, and NS23 may be connected to a second string select line SSL2. Some of the cell strings NS31, NS32, and NS33 may be connected to a third string select line SSL3.

Each of the plurality of cell strings NS11, NS21, NS31, NS12, NS22, NS32, NS13, NS23, and NS33 may include a string select transistor SST connected to each of the string select lines. In addition, each of the plurality of cell strings NS11, NS21, NS31, NS12, NS22, NS32, NS13, NS23, and NS33 may include a ground select transistor GST connected to each of the ground select lines.

One end of the ground select transistor in each of the plurality of cell strings NS11, NS21, NS31, NS12, NS22, NS32, NS13, NS23, and NS33 may be connected to the common source line CSL. In addition, each of the plurality of cell strings NS11, NS21, NS31, NS12, NS22, NS32, NS13, NS23, and NS33 may have a plurality of memory cells sequentially stacked in the third direction z between the ground select transistor and the string select transistor. Although not shown in the drawing, each of the plurality of cell strings NS11, NS21, NS31, NS12, NS22, NS32, NS13, NS23, and NS33 may include dummy cells between the ground select transistor and the string select transistor. Alternatively or additionally, the number of the string select transistors included in each string is not limited to the drawings.

For example, the cell string NS11 may include a ground select transistor GST11 disposed at the lowermost end in the third direction z, a plurality of memory cells M11_1 to M11_8 sequentially stacked on the ground select transistor GST11 in the third direction z, and a string select transistor SST11 stacked on the uppermost memory cell M11_8 in the third direction z. Alternatively or additionally, the cell string NS21 may include a ground select transistor GST21 disposed at the lowermost end in the third direction z, a plurality of memory cells M21_1 to M21_8 sequentially stacked on the ground select transistor GST21 in the third direction z, and a string select transistor SST21 stacked on the uppermost memory cell M21_8 in the third direction z. Alternatively or additionally, the cell string NS31 may include a ground select transistor GST31 disposed at the lowermost end in the third direction z, a plurality of memory cells M31_1 to M31_8 sequentially stacked on the ground select transistor GST31 in the third direction z, and a string select transistor SST31 stacked on the uppermost memory cell M31_8 in the third direction z. The configuration of the other strings may also be similar thereto.

The memory cells positioned at the same height in the third direction z from the substrate (not shown) or the ground select transistor may be electrically connected in common through each word line. For example, the memory cells formed at the same height as the memory cells M11_1, M21_1, and M31_1 may be connected to a first word line WL1. Alternatively or additionally, the memory cells formed at the same height as the memory cells M11_2, M21_2, and M31_2 may be connected to a second word line WL2. Hereinafter, since the arrangement and structure of the memory cells connected to a third word line WL3 to an eighth word line WL8 are similar to the above, a description thereof will be omitted.

One end of each string select transistor of the plurality of cell strings NS11, NS21, NS31, NS12, NS22, NS32, NS13, NS23, and NS33 may be connected to a bit line BL1, BL2, or BL3. For example, the string select transistors SST11, SST21, and SST31 may be connected to the bit line BL1 extending in the second direction y. A description of the other string select transistors connected to the bit lines BL2 or BL3 may be similar to the above, and thus a description thereof will be omitted.

The memory cells corresponding to one string (or ground) select line and one word line may form one page. A write operation and a read operation may be performed on a page basis. Each of the memory cells in each page may store two or more bits. Bits written to the memory cells of each page may form logical pages.

The memory cell array MCA may be provided as a three-dimensional memory array. The three-dimensional memory array may be monolithically formed on one or more physical levels of arrays of the memory cells having an active area disposed on a substrate (not shown) and a circuit involved in the operation of the memory cells. The circuit involved in the operation of the memory cells may be located within or on the substrate. Being monolithically formed corresponds to layers of each level of the three-dimensional array being deposited directly on the lower level layers of the three-dimensional array. Furthermore, memory cells such as memory cells M11_1, M21_1, M31_1, M11_2, M21_2, M31_2, etc. may be single-level cells, or may be multiple-level cells; however, example embodiments are not limited thereto.

Figure 5:
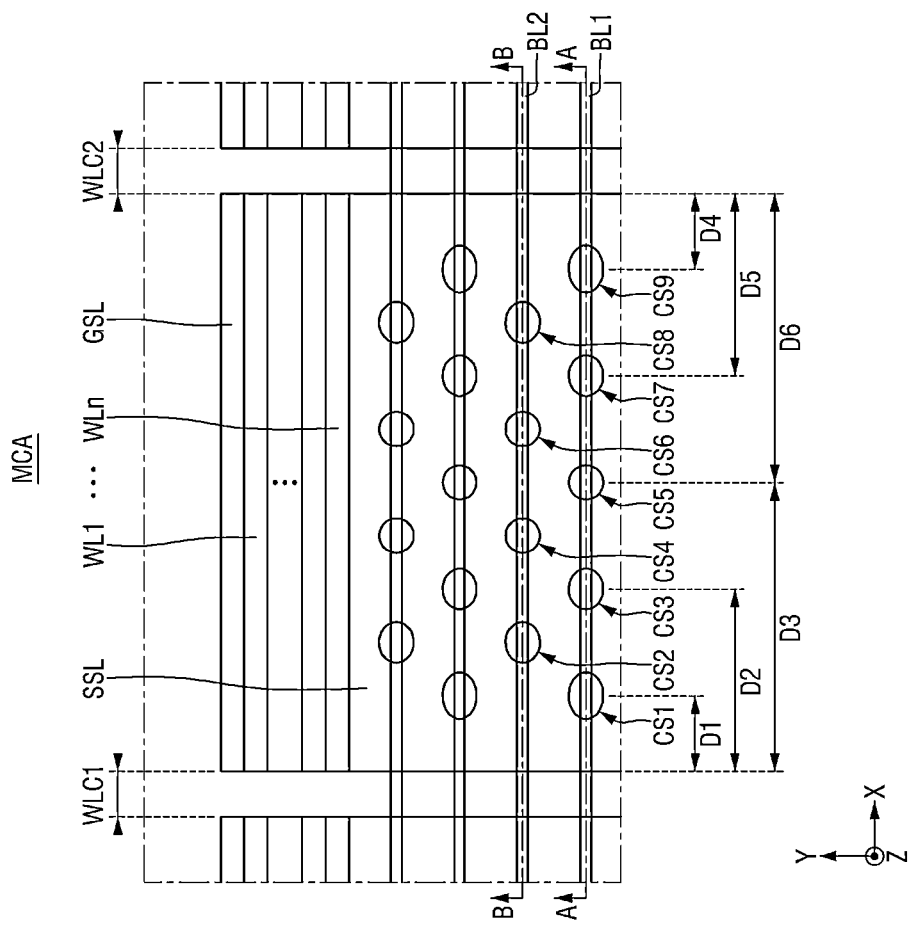
FIG. 5 is a top view of a memory cell array according to some example embodiments.
Figure 6:
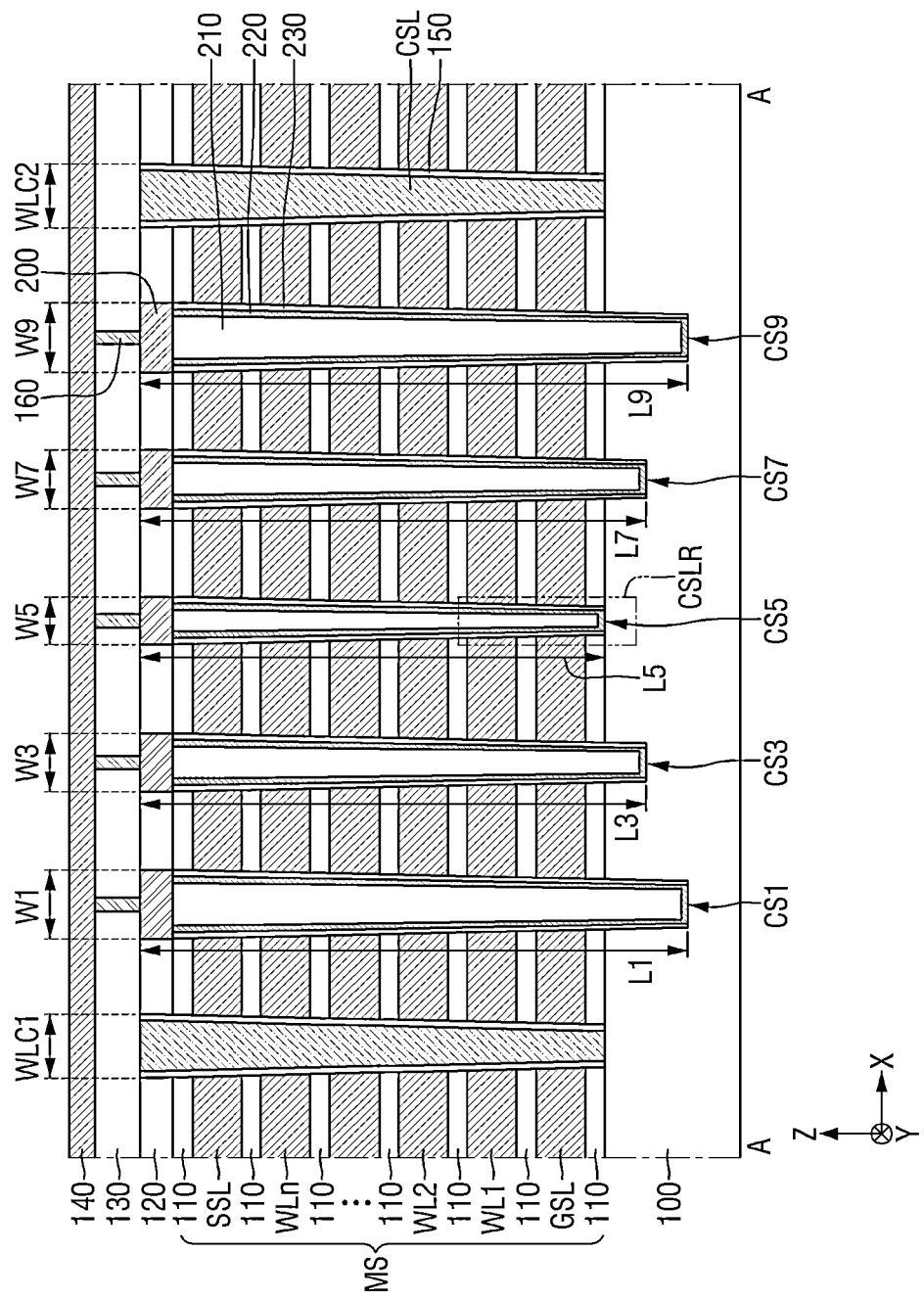
FIG. 6 is an example cross-sectional view taken along line A-A of FIG. 5.
Figure 7:
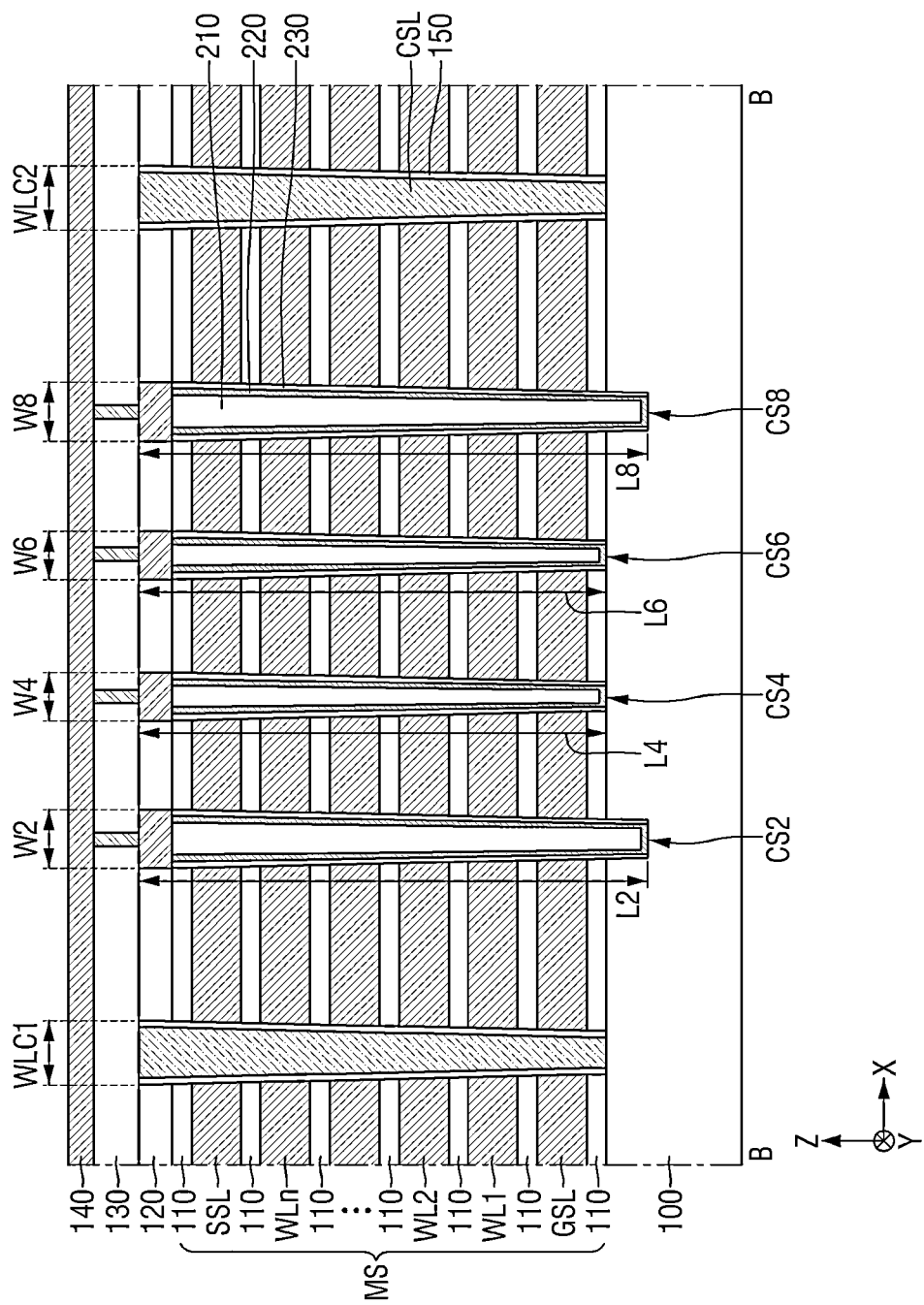
FIG. 7 is an example cross-sectional view taken along line B-B of FIG. 5.

FIG. 5 is a top view of a memory cell array according to some example embodiments. FIG. 6 is an example cross-sectional view taken along line A-A of FIG. 5. FIG. 7 is an example cross-sectional view taken along line B-B of FIG. 5.

Referring to FIGS. 5 to 7, the memory cell array MCA may include a substrate 100, a mold structure MS, channel structures CS1 to CS9, and bit lines BL1 and BL2.

The substrate 100 may be or may include, for example, a semiconductor substrate such as a silicon substrate, a germanium substrate, or a silicon-germanium substrate. Alternatively, the substrate 100 may be a silicon-on-insulator (SOI) substrate or a germanium-on-insulator (GOI) substrate. The substrate 100 may be doped, e.g. may be lightly doped with boron; however, example embodiments are not limited thereto. The substrate 100 may include a single-crystal material; however, example embodiments are not limited thereto.

The mold structure MS may be formed on the substrate 100. The mold structure MS may include the plurality of gate electrodes GSL, WL1 to WLn, and SSL and a plurality of first insulating patterns 110 which are stacked on the substrate 100. For example, each of the gate electrodes GSL, WL1 to WLn, and SSL and each of the first insulating patterns 110 may have a layered structure extending in the first direction X and the second direction Y. The mold structure MS may include a ground select line GSL, a plurality of word lines WL1 to WLn, and a string select line SSL that are sequentially stacked, and first insulating patterns 110 disposed between the gate electrodes GSL, WL1 to WLn, and SSL. In addition, the ground select line GSL, the plurality of word lines WL1 to WLn, and the string select line SSL may be stacked in a staircase shape.

The ground select line GSL and the plurality of word lines WL1 to WLn may include a conductive material. For example, the ground select line GSL and the plurality of word lines WL1 to WLn may include a metal such as at least one of tungsten (W), cobalt (Co), or nickel (Ni), or a semiconductor material such as polycrystalline or single-crystalline silicon, but inventive concepts are not limited thereto. The string select line SSL may include a conductive material. For example, the string select line SSL may include doped or undoped polysilicon, but is not limited thereto.

Each of the first insulating patterns 110 may include an insulating material. For example, the first insulating pattern 110 may include silicon oxide, but is not limited thereto.

The plurality of channel structures CS1 to CS9 may penetrate the mold structure MS to be connected to the substrate 100. The plurality of channel structures CS1 to CS9 may penetrate the plurality of gate electrodes GSL and WL1 to WLn to be connected to the substrate 100.

Referring to FIG. 6, each of the channel structures CS1 to CS9 may have a pillar shape extending in the third direction Z. Each of the channel structures CS1 to CS9 may extend in a direction crossing the plurality of gate electrodes GSL, WL1 to WLn, and SSL. Further, the channel structures CS1 to CS9 may include a channel pad 200, a filling pattern 210, a semiconductor pattern 220, and an information storage layer 230.

The semiconductor pattern 220 may penetrate the mold structure MS. For example, the semiconductor pattern 220 may extend in the third direction Z. The semiconductor pattern 220 is shown in a cup shape, but this is merely an example. For example, the semiconductor pattern 220 may have various shapes such as a cylindrical shape, a rectangular tube shape, and/or a solid pillar shape. The semiconductor pattern 220 may include, for example, a semiconductor material such as at least one of monocrystalline silicon, polycrystalline silicon, organic semiconductor material, and carbon nanostructure, but is not limited thereto.

The information storage layer 230 may be interposed between the semiconductor pattern 220 and each of the gate electrodes (e.g., the ground select line GSL, the plurality of word lines WL1 to WLn, or the string select line SSL). For example, the information storage layer 230 may extend along the side surface of the semiconductor pattern 220.

The information storage layer 230 may include, for example, at least one of silicon oxide, silicon nitride, silicon oxynitride, or a high dielectric constant material having a higher dielectric constant than silicon oxide. The high dielectric constant material may include, for example, at least one selected from the group consisting of or including aluminum oxide, hafnium oxide, lanthanum oxide, tantalum oxide, titanium oxide, lanthanum hafnium oxide, lanthanum aluminum oxide, dysprosium scandium oxide and a combination thereof.

Although not shown, the information storage layer 230 may include a plurality of layers. For example, the information storage layer 230 may include a tunnel insulating layer, a charge storage layer, and a blocking insulating layer that are sequentially stacked on the semiconductor pattern 220.

The tunnel insulating layer may include, for example, silicon oxide and/or a high dielectric constant material (e.g., aluminum oxide ($Al_2O_3$) and/or hafnium oxide ($HfO_2$)) having a higher dielectric constant than silicon oxide. The charge storage layer may include, for example, silicon nitride. The blocking insulating layer may include, for example, silicon oxide and/or a high dielectric constant material (e.g., aluminum oxide ($Al_2O_3$) or hafnium oxide ($HfO_2$)) having a higher dielectric constant than silicon oxide.

Each of the channel structures CS1 to CS9 may include the filling pattern 210. The filling pattern 210 may be formed to fill an interior of the semiconductor pattern 220 having a cup shape. For example, the semiconductor pattern 220 may extend along side and bottom surfaces of the filling pattern 210. The filling pattern 210 may include, for example, silicon oxide, but is not limited thereto.

Each of the channel structures CS1 to CS9 may include the channel pad 200 on the top of the filling pattern 210, the semiconductor pattern 220, and the information storage layer 230 in the third direction Z. The channel pad 200 may be formed to be connected to an upper portion of the semiconductor pattern 220. For example, the channel pad 200 may be formed in a first interlayer insulating layer 120 formed on the mold structure MS.

FIG. 6 illustrates that the channel pad 200 is formed on the top surface of the semiconductor pattern 220, but this is merely an example. For example, an upper part of the semiconductor pattern 220 may be formed to extend along the side surface of the channel pad 200. The channel pad 200 may include, for example, polysilicon doped with impurities, but is not limited thereto.

Figure 8:
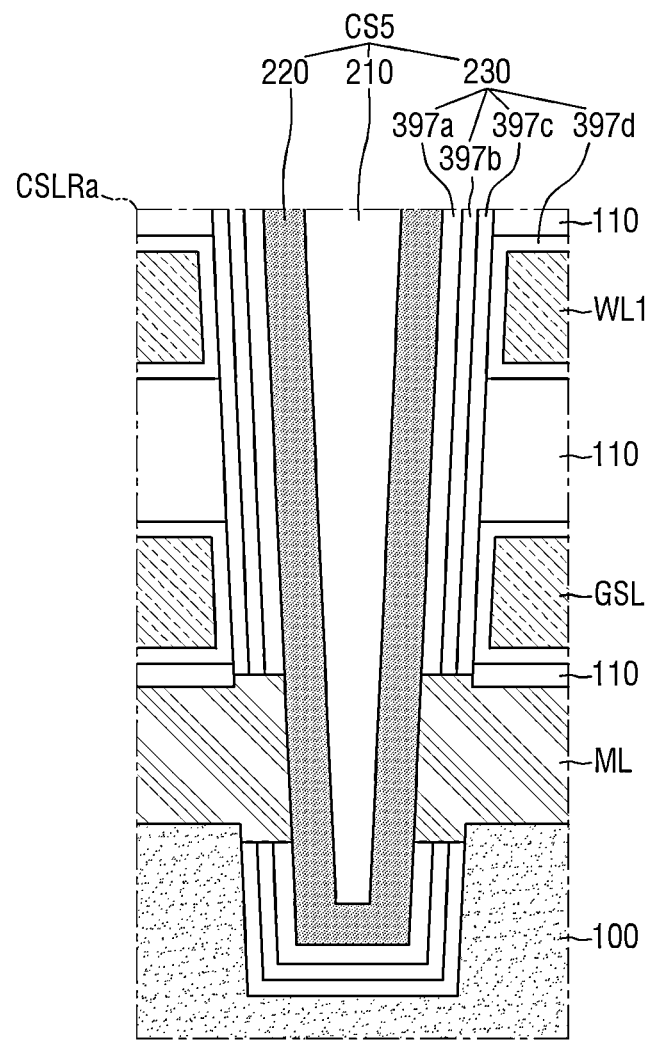
FIGS. 8 and 9 are enlarged views of a CSLR region of FIG. 6.
Figure 9:
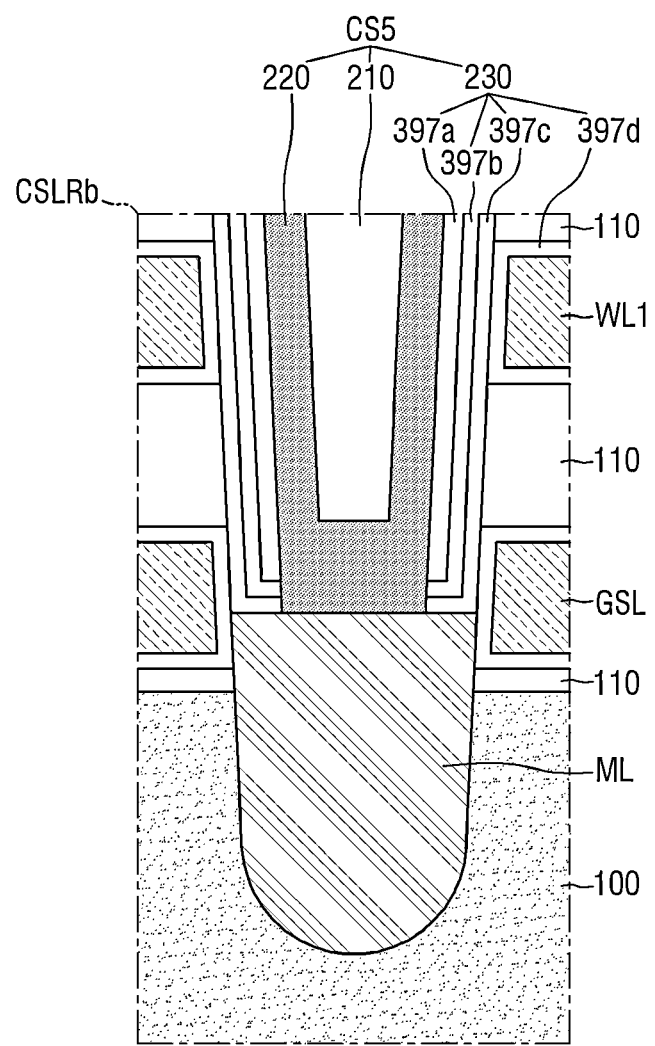

FIGS. 8 and 9 are enlarged views of a CSLR region of FIG. 6.

Referring to FIG. 8, the fifth channel structure CS5 may extend in the vertical direction Z. The fifth channel structure CS5 may include the filling pattern 210, the semiconductor pattern 220, and the information storage layer 230. The ground select line GSL may be insulated from the first word line WL1 by the first insulating pattern 110.

The information storage layer 230 may be interposed between the semiconductor pattern 220 and each of the ground select line GSL and the plurality of word lines WL1 to WLn. For example, the information storage layer 230 may extend along the side surface of the semiconductor pattern 220.

In some example embodiments, the information storage layer 230 may be formed of multiple films. For example, the information storage layer 230 may include a tunnel insulating layer 397a, a charge storage layer 397b, and a blocking insulating layer 397c that are sequentially stacked on the semiconductor pattern 220. The tunnel insulating layer 397a may include, for example, silicon oxide or a high dielectric constant material (e.g., aluminum oxide ($Al_2O_3$) and/or hafnium oxide ($HfO_2$)) having a higher dielectric constant than silicon oxide. The charge storage layer 397b may include, for example, silicon nitride. The blocking insulating layer 397c may include, for example, silicon oxide and/or a high dielectric constant material having a higher dielectric constant than that of silicon oxide. In some example embodiments, the information storage layer 230 may further include a gate insulating layer 397d extending along the surface of each of the gate electrodes GSL and WL1 to WLn.

A common source line ML may be formed to be connected to the semiconductor pattern 220 of the fifth channel structure CS5. As shown in FIG. 8, in some example embodiments, the fifth channel structure CS5 may penetrate the common source line ML and may be buried in the substrate 100. The common source line ML may be connected to the side surface of the semiconductor pattern 220 while penetrating a part of the information storage layer 230.

As shown in FIG. 9, in some example embodiments, at least a part of the common source line ML may be buried in the substrate 100. The common source line ML may be formed from, e.g., the substrate 100 by a selective epitaxial growth (SEG) process. The semiconductor pattern 220 may penetrate a part of the information storage layer 230 and may be connected to the top surface of the common source line ML.

Referring back to FIGS. 5 to 7, the plurality of channel structures CS1 to CS9 may be arranged in zigzags. The plurality of channel structures CS1 to CS9 may be alternately arranged in the first direction X and the second direction Y. The plurality of channel structures CS1 to CS9 arranged in zigzags may improve the integration density of the memory storage device 10. For example, the first to ninth channel structures CS1 to CS9 may be arranged in zigzags. The first channel structure CS1, the third channel structure CS3, the fifth channel structure CS5, the seventh channel structure CS7, and the ninth channel structure CS9 may be sequentially arranged in the first direction X. The second channel structure CS2, the fourth channel structure CS4, the sixth channel structure CS6, and the eighth channel structure CS8 may be sequentially arranged in the first direction X.

Along the first direction X, the first channel structure CS1 may be neighboring the third channel structure CS3, the third channel structure CS3 may be neighboring the fifth channel structure CS5, the fifth channel structure CS5 may be neighboring the seventh channel structure CS7, and the seventh channel structure CS7 may be neighboring the ninth channel structure CS9. Along the first direction X, the channel structure CS2 may be neighboring to the fourth channel structure CS4, the fourth channel structure CS4 may be neighboring to the sixth channel structure CS6, and the sixth channel structure CS6 may be neighboring to the eight channel structure CS8.

The first to ninth channel structures CS1 to CS9 may be formed in the mold structure MS and the substrate 100 between a first word line cut region WLC1 and a second word line cut region WLC2.

The first word line cut region WLC1 may extend in the second direction Y and the third direction Z while cutting the mold structure MS. The first word line cut region WLC1 may include a common source line spacer 150 formed along a trench and the common source line CSL filling the trench. The second word line cut region WLC2 may be disposed to be spaced apart from the first word line cut region WLC1 in the first direction X. The second word line cut region WLC2 may extend in the second direction Y and the third direction Z while cutting the mold structure MS. The second word line cut region WLC2 may include the common source line spacer 150 formed along a trench and the common source line CSL filling the trench.

The channel structures CS1 to CS9 penetrating the mold structure MS may have widths decreasing toward the top surface of the substrate 100. This may be due to characteristics of an etching process for forming the mold structure MS. The channel structures CS1 to CS9 may have a tapered profile.

Subsequently, the plurality of bit lines 140 may extend side by side while being spaced apart from each other. Here, the bit line 140 may include a first bit line BL1 and a second bit line BL2. For example, each of the bit lines 140 may extend in the first direction X. The first bit line BL1 and the second bit line BL2 may be spaced apart from each other in the second direction Y. Each of the bit lines 140 may be electrically connected to the plurality of channel structures CS1 to CS9. For example, the bit line 140 may be electrically connected to the plurality of channel structures CS1 to CS9 via bit line contacts 160. The bit line contact 160 may pass through, for example, the second interlayer insulating layer 130 to electrically connect the bit line 140 to each of the channel structures CS1 to CS9.

The above-described first interlayer insulating layer 120 and second interlayer insulating layer 130 may be made of at least one of a high density plasma (HDP) oxide, tetra-ethyl-ortho-silicate (TEOS), plasma enhanced TEOS (PE-TEOS), O3-TEOS, undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or a combination thereof. However, inventive concepts are not limited thereto. In addition, the first interlayer insulating layer 120 and the second interlayer insulating layer 130 may include at least one of silicon nitride, silicon oxynitride, or a low-k material having a low dielectric constant, but is not limited thereto.

Referring to FIGS. 5 to 7, the first channel structure CS1, the third channel structure CS3, the fifth channel structure CS5, the seventh channel structure CS7 and the ninth channel structure CS9 may be connected to the first bit line BL1. Further, the second channel structure CS2, the fourth channel structure CS4, the sixth channel structure CS6, and the eighth channel structure CS8 may be connected to the second bit line BL2. In this case, the first bit line BL1 and the second bit line BL2 may be different bit lines that are spaced apart from each other in the second direction Y. The first bit line BL1 and the second bit line BL2 may not be contiguous with each other.

Referring to FIGS. 5 and 7, the first channel structure CS1, the third channel structure CS3, the fifth channel structure CS5, the seventh channel structure CS7 and the ninth channel structure CS9 may be sequentially arranged in the first direction X. That is, the first channel structure CS1, the third channel structure CS3, the fifth channel structure CS5, the seventh channel structure CS7, and the ninth channel structure CS9 may be disposed between the first word line cut region WLC1 and the second word line cut region WLC2.

The width of the first channel structure CS1 in the first direction X may be a first width W1, the width of the third channel structure CS3 in the first direction X may be a third width W3, the width of the fifth ninth channel structure CS5 in the first direction X may be a fifth width W5, the width of the seventh channel structure CS7 in the first direction X may be a seventh width W7, and the width of the ninth channel structure CS9 in the first direction X may be a ninth width W9. In this case, or in an event wherein a profile of the channel structures CS1 to CS9 are tapered, the width of each channel structure may be the width of the top hole of each channel structure.

The first channel structure CS1 may be spaced apart from the first word line cut region WLC1 by a first distance D1. The third channel structure CS3 may be spaced apart from the first word line cut region WLC1 by a second distance D2. The fifth channel structure CS5 may be spaced apart from the first word line cut region WLC1 by a third distance D3.

The ninth channel structure CS9 may be spaced apart from the second word line cut region WLC2 by a fourth distance D4. The seventh channel structure CS7 may be spaced apart from the second word line cut region WLC2 by a fifth distance D5. The fifth channel structure CS5 may be spaced apart from the second word line cut region WLC2 by a sixth distance D6.

In this case, the first distance D1 may be the same as the fourth distance D4, the second distance D2 may be the same as the fifth distance D5, and the third distance D3 may be the same as the sixth distance D6. The first to ninth channel structures CS1 to CS9 may be symmetrically disposed with respect to the fifth channel structure CS5. However, example embodiments of inventive concepts are not limited thereto.

The length of the first channel structure CS1 in the third direction Z (e.g. the height of the first channel structure CS1) may be a first length L1, the length of the third channel structure CS3 in the third direction Z may be a third length L3, the length of the fifth channel structure CS5 in the third direction Z may be a fifth length L5, the length of the seventh channel structure CS7 in the third direction Z may be a seventh length L7, and the length of the ninth channel structure CS9 in the third direction Z may be a ninth length L9. In this case, the length of the channel structure may be a depth at which the channel structure is formed.

Here, the first width W1 may be greater than the third width W3, and the third width W3 may be greater than the fifth width W5. The ninth width W9 may be greater than the seventh width W7, and the seventh width W7 may be greater than the fifth width W5. Among the first width W1, the third width W3, and the fifth width W5, the farther from the first word line cut region WLC1 may be smaller. Among the ninth width W9, the seventh width W7, and the fifth width W5, the farther from the second word line cut region WLC2 may be smaller. Accordingly, top holes of the first and ninth channel structures CS1 and CS9, which are respectively located adjacent to the first and second word line cut regions WLC1 and WLC2, may be formed to be open, and thus the reliability of the memory cell array MCA can be improved.

Further, in example embodiments of inventive concepts, the first width W1 may be the same as the ninth width W9, and the third width W3 may be the same as the seventh width W7.

Here, the first length L1 may be greater than the third length L3, and the third length L3 may be greater than the fifth length L5. The ninth length L9 may be greater than the seventh length L7, and the seventh length L7 may be greater than the fifth length L5. Among the first length L1, the third length L3, and the fifth length L5, the farther from the first word line cut region WLC1 may be smaller. Among the ninth length L9, the seventh length L7, and the fifth length L5, the farther from the second word line cut region WLC2 may be smaller Here, the difference among the first length L1, the third length L3, the fifth length L5, the seventh length L7, and the ninth length L9 may be due to the difference among the first width W1, the third width W3, the fifth width W5, the seventh width W7, and the ninth width W9.

Further, in example embodiments of inventive concepts, the first length L1 may be the same as the ninth length L9, and the third length L3 may be the same as the seventh length L7.

Referring to FIGS. 5 and 7, the second channel structure CS2, the fourth channel structure CS4, the sixth channel structure CS6, and the eighth channel structure CS8 may be sequentially arranged in the first direction X. The second channel structure CS2, the fourth channel structure CS4, the sixth channel structure CS6, and the eighth channel structure CS8 may be disposed between the first word line cut region WLC1 and the second word line cut region WLC2.

The width of the second channel structure CS2 in the first direction X may be a second width W2, the width of the fourth channel structure CS4 in the first direction X may be a fourth width W4, the width of the sixth channel structure CS6 in the first direction X may be a sixth width W6, and the width of the eighth channel structure CS8 in the first direction X may be an eighth width W8. In this case, the width of each channel structure may be the width of the top hole of each channel structure.

The second channel structure CS2 may be spaced apart from the first word line cut region WLC1 by a distance that is greater than the first distance D1 and smaller than the second distance D2. The fourth channel structure CS4 may be spaced apart from the first word line cut region WLC1 by a distance that is greater than the second distance D2 and smaller than the third distance D3. The eighth channel structure CS8 may be spaced apart from the second word line cut region WLC2 by a distance greater than the fourth distance D4 and smaller than the fifth distance D5. The sixth channel structure CS6 may be spaced apart from the second word line cut region WLC2 by a distance greater than the fifth distance D5 and smaller than the sixth distance D6.

The length of the second channel structure CS2 in the third direction Z may be a second length L2, the length of the fourth channel structure CS4 in the third direction Z may be a fourth length L4, the length of the sixth channel structure CS6 in the third direction Z may be a sixth length L6, and the length of the eighth channel structure CS8 in the third direction Z may be an eighth length L8. In this case, the length of the channel structure may be a depth (or a height in the Z direction) at which the channel structure is formed.

Here, the second width W2 may be greater than the fourth width W4, and the eighth width W8 may be greater than the sixth width W6. The second width W2 may be the same as the eighth width W8, and the fourth width W4 may be the same as the sixth width W6. Further, the fourth width W4 and the sixth width W6 may be the same as the fifth width W5, but example embodiments of inventive concepts are not limited thereto.

Here, the second length L2 may be greater than the fourth length L4, and the eighth length L8 may be greater than the sixth length L6. The second length L2 may be the same as the eighth length L8, and the fourth length L4 may be the same as the sixth length L6. Here, the difference among the second length L2, the fourth length L4, the sixth length L6, and the eighth length L8 may be due to the difference among the second width W2, the fourth width W4, the sixth width W6 and the eighth width W8.

Hereinafter, the memory cell array MCA according to another embodiment will be described with reference to FIGS. 10 and 11.

Figure 10:
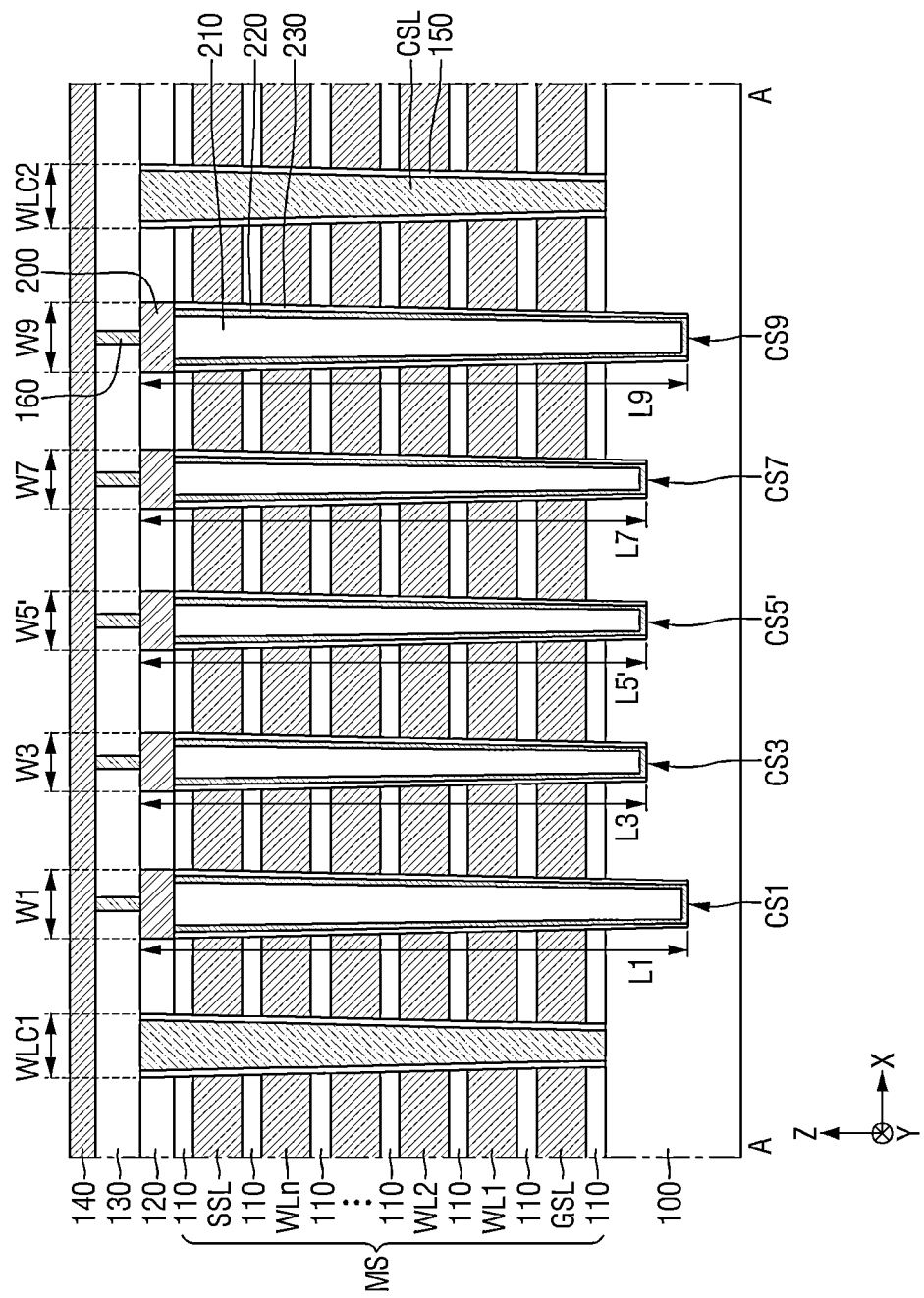
FIG. 10 is an example cross-sectional view taken along line A-A of FIG. 5.

FIG. 10 is an example cross-sectional view taken along line A-A of FIG. 5. FIG. 11 is an example cross-sectional view taken along line B-B of FIG. 5. For simplicity of description, redundant parts of the description made with reference to FIGS. 1 to 9 will be recapitulated or omitted.

Figure 11:
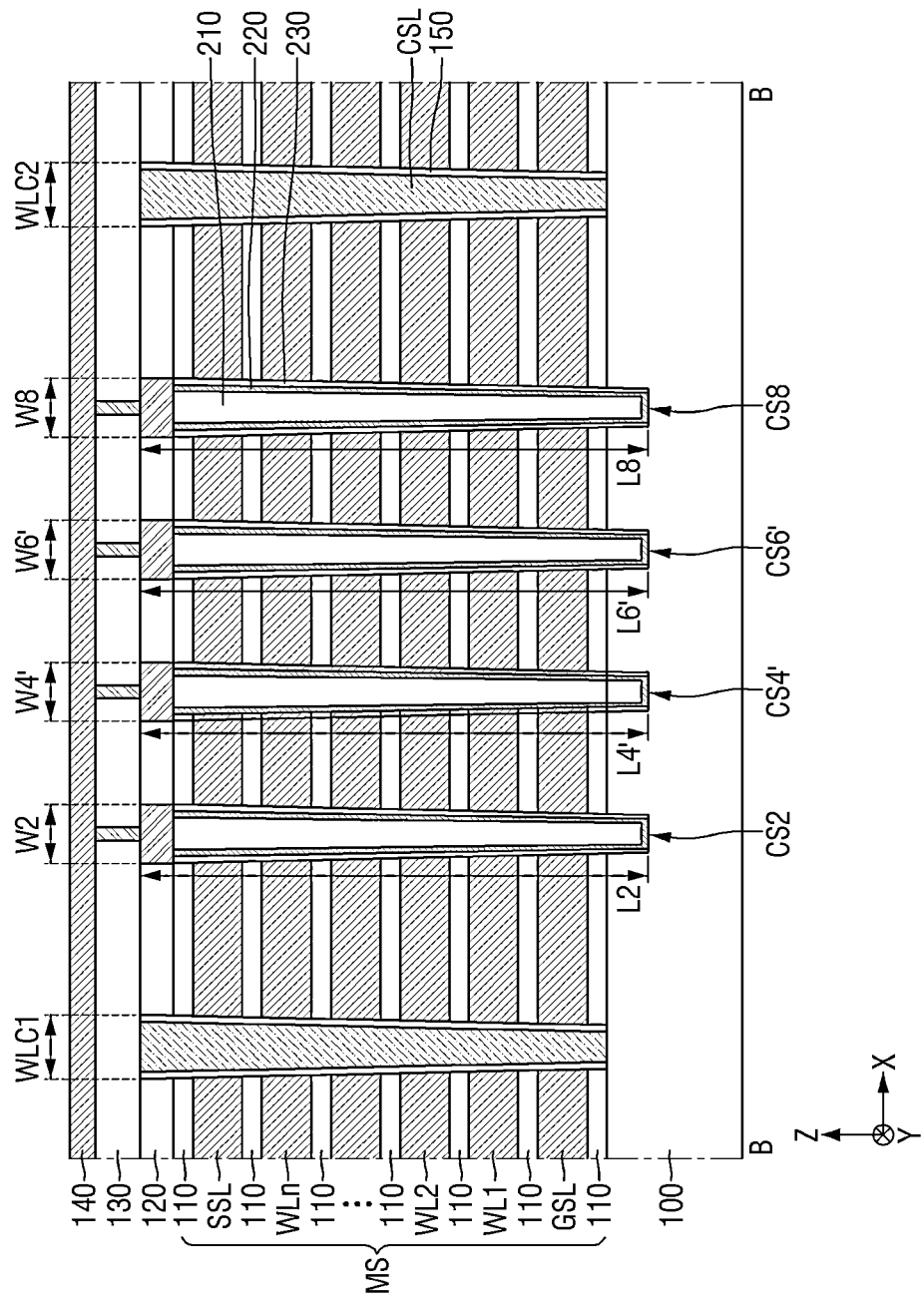
FIG. 11 is an example cross-sectional view taken along line B-B of FIG. 5.

Referring to FIGS. 10 and 11, the memory cell array MCA may include a fourth channel structure CS4', a fifth channel structure CS5', and a sixth channel structure CS6'.

The first to third channel structures CS1 to CS3 and the seventh to ninth channel structures CS7 to CS9 of the memory cell array MCA may be the same as or similar to the first to third channel structures CS1 to CS3 and the seventh to ninth channel structures CS7 to CS9 of the memory cell array MCA described with reference to FIGS. 1 to 9. The fourth channel structure CS4', the fifth channel structure CS5', and the sixth channel structure CS6' may be different from the fourth channel structure CS4, the fifth channel structure CS5 and the sixth channel structure CS6 described with reference to FIGS. 1-9.

The width and the length of the fourth channel structure CS4' may be a fourth width W4' and a fourth length L4', respectively. The width and the length of the fifth channel structure CS5' may be a fifth width W5' and a fifth length L5', respectively. The width and the length of the sixth channel structure CS6' may be a sixth width W6' and a sixth length L6', respectively.

Here, the fourth width W4', the fifth width W5', and the sixth width W6' may all be the same, and the fourth length L4', the fifth length L5', and the sixth length L6' may all be the same. Further, the second and third widths W2 and W3, the fourth to sixth widths W4' to W6', and the seventh and eighth widths W7 and W8 may all be the same, and may be smaller than the first width W1 and the ninth width W9. Furthermore, the second and third lengths L2 and L3, the fourth to sixth lengths L4' to L6', and the seventh and eighth lengths L7 and L8 may all be the same, and may be smaller than the first length L1 and the ninth length L9.

The first and ninth widths W1 and W9, and the first and ninth lengths L1 and L9 of the first and ninth channel structures CS1 and CS9, which are located at the outermost sides, may be greater than other widths and lengths, so that a not-open phenomenon of a channel hole can be prevented or reduced in likelihood of occurrence and/or of impact.

Hereinafter, the memory cell array MCA according to still another embodiment will be described with reference to FIG. 12.

Figure 12:
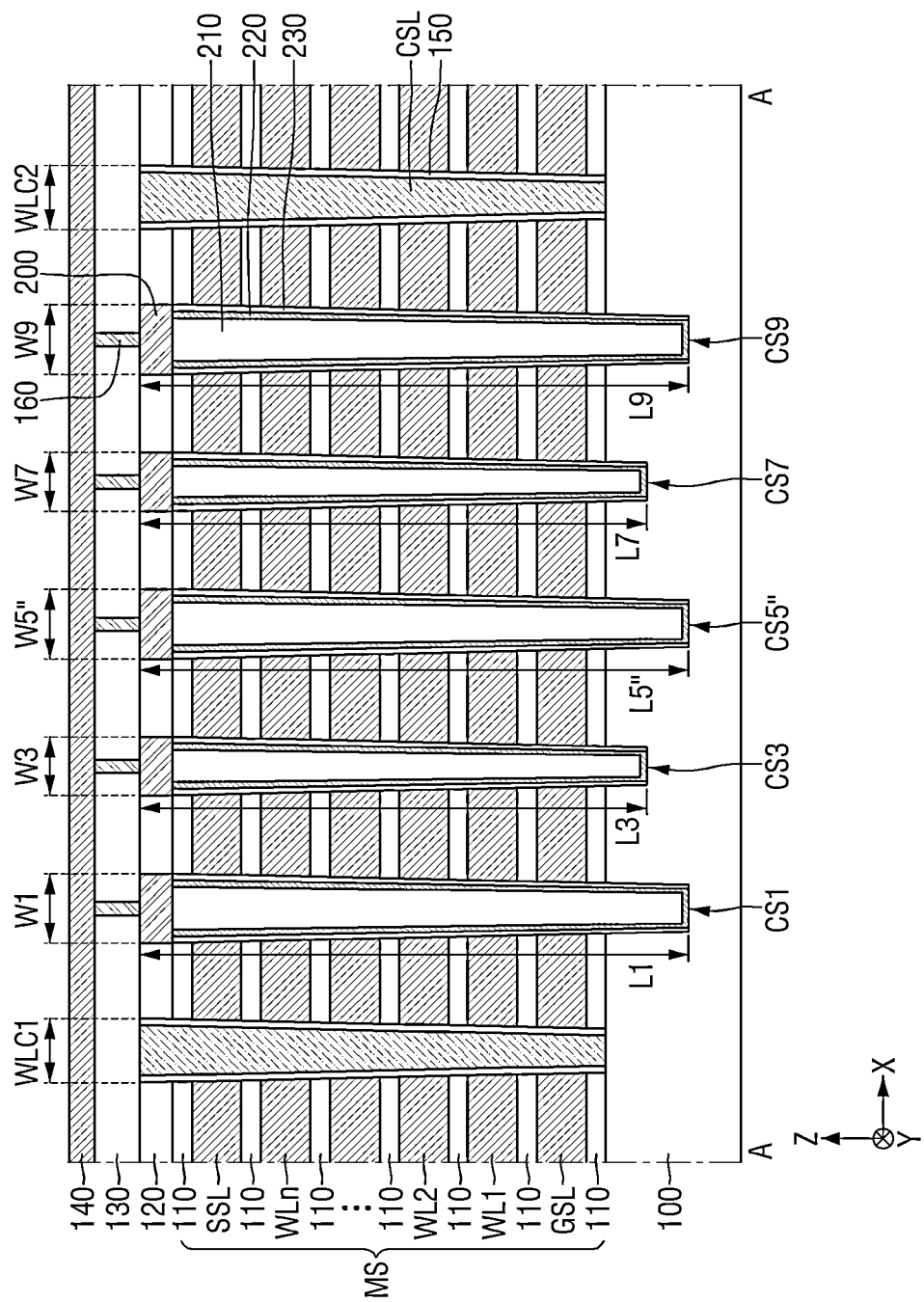
FIG. 12 is an example cross-sectional view taken along line A-A of FIG. 5.

FIG. 12 is an example cross-sectional view taken along line A-A of FIG. 5. For simplicity of description, redundant parts of the description made with reference to FIGS. 1 to 9 will be recapitulated or omitted.

Referring to FIG. 12, the memory cell array MCA may include a fifth channel structure CS5". Here, the fifth channel structure CS5" may be disposed instead of the fifth channel structure CS5 of the memory cell array MCA described with reference to FIGS. 1 to 9.

The width and the length of the fifth channel structure CS5" may be a fifth width W5" and a fifth length L5", respectively. In this case, the fifth width W5" may be the same as the first width W1 and the ninth width W9, and the fifth length L5" may be the same as the first length L1 and the ninth length L9. The fifth width W5" may be greater than the third width W3 and the seventh width W7, and the fifth length L5" may be greater than the third length L3 and the seventh length L7.

Figure 13:
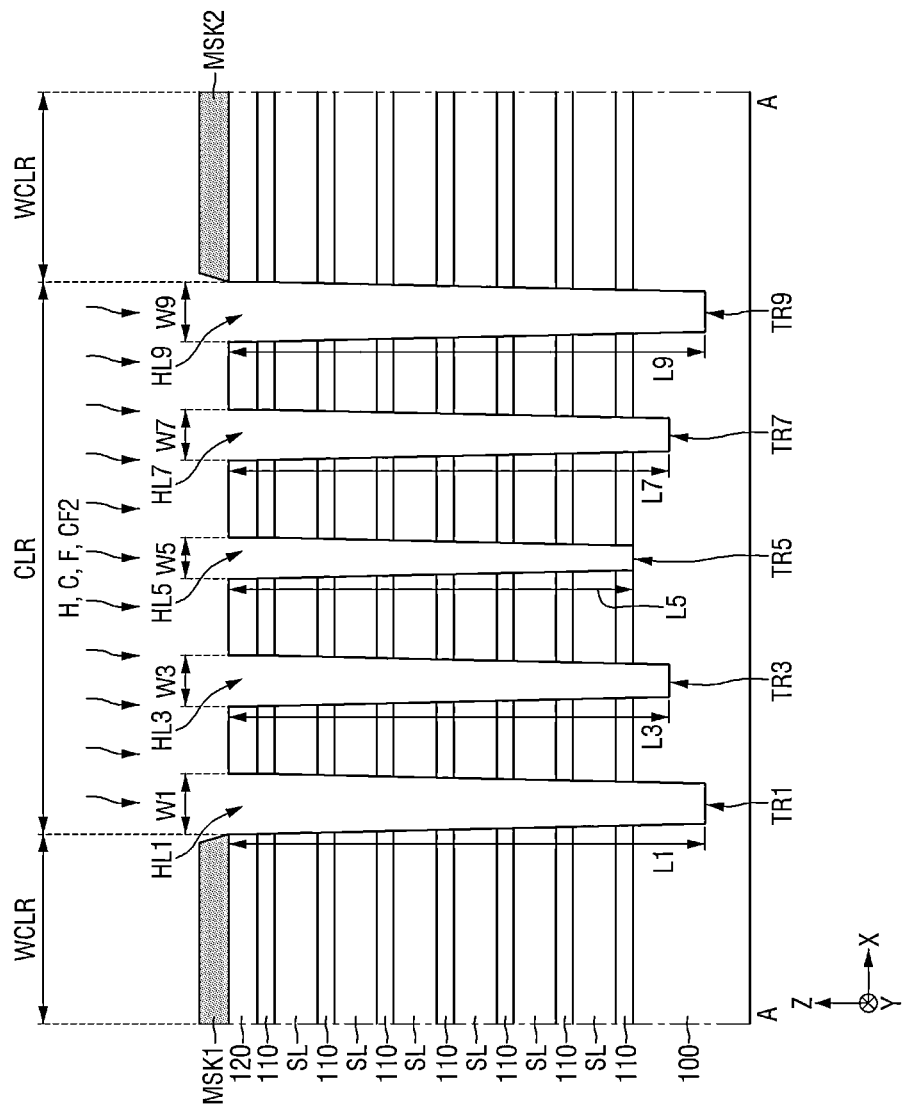
FIGS. 13 to 15 are diagrams illustrating a method for fabricating a memory cell array according to some example embodiments.
Figure 14:
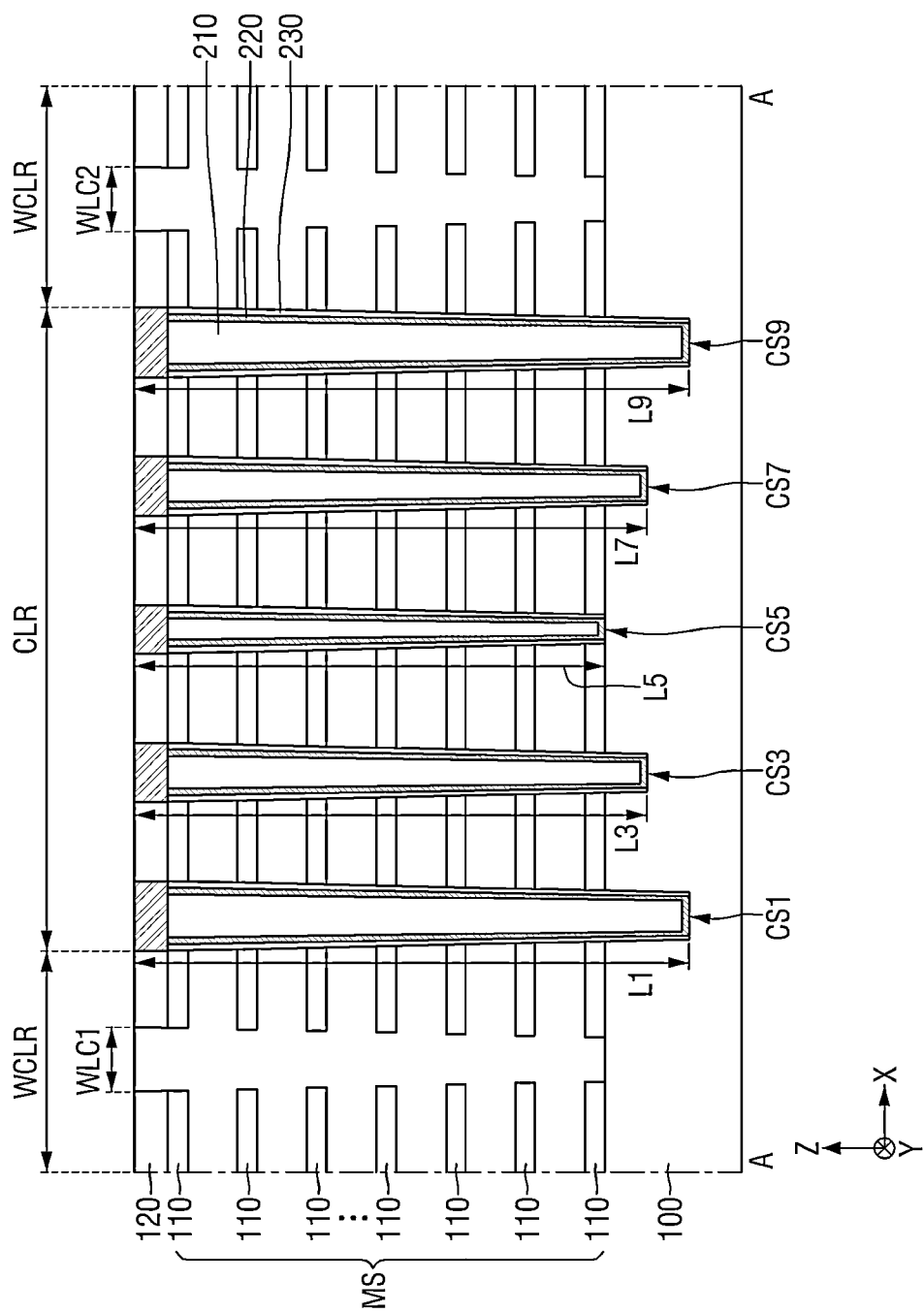
Figure 15:
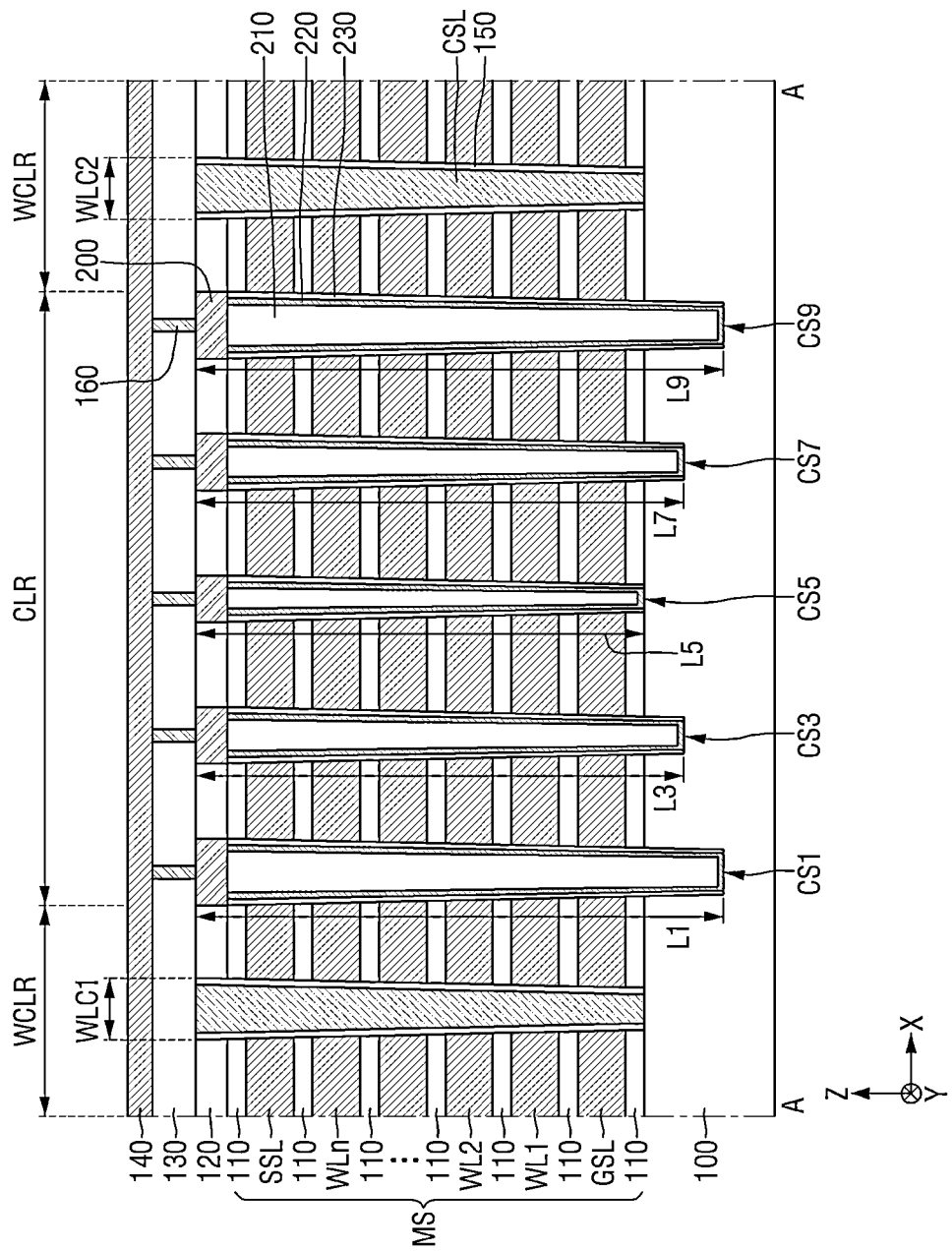

FIGS. 13 to 15 are diagrams illustrating a method for fabricating a memory cell array according to some example embodiments.

Referring to FIG. 13, the memory cell array MCA may include a word line cut region WLCR and a cell region CLR. Here, the word line cut region WLCR may be a region in which the first and second word line cut regions WLC1 and WLC2 are formed later. The cell region CLR may be a region in which the plurality of channel structures CS1 to CS9 are formed later.

The first insulating pattern 110 and a sacrificial layer SL may be alternately stacked on the substrate 100. Here, the sacrificial layer SL may include at least one of silicon nitride, silicon oxynitride, silicon-rich nitride, or nanocrystalline silicon.

A first mask MSK1 and a second mask MSK2 may be formed on the first interlayer insulating layer 120 corresponding to the word line cut region WCLR. The first and second masks MSK1 and MSK2 may prevent, or reduce the likelihood of occurrence and/or of impact from, the mold structure MS from being exposed and etched in an exposure process. The first mask MSK1 and the second mask MSK2 may be formed at the same time or may be formed at different times.

A low temperature etching process may be performed on the memory cell array MCA. In this case, the low temperature etching process may be performed at a temperature below zero degrees Celsius. For example, the memory cell array MCA may be etched in an environment of −10 degrees Celsius. The memory cell array MCA may be etched using a gas having a low molecular weight, such as H, C, F, or CF2. Through this, first to ninth trenches TR1 to TR9 may be formed.

The first trench TR1 may have the first length L1 and the first width W1. Further, the first trench TR1 may include a first hole HL1 in the top surface of the first interlayer insulating layer 120. In this case, the width of the first hole HL1 in the first direction X may be the first width W1. The third trench TR3 may have the third length L3 and the third width W3. Further, the third trench TR3 may include a third hole HL3 in the top surface of the first interlayer insulating layer 120. In this case, the width of the third hole HL3 in the first direction X may be the third width W3. The fifth trench TR5 may have the fifth length L5 and the fifth width W5. Further, the fifth trench TR5 may include a fifth hole HL5 in the top surface of the first interlayer insulating layer 120. In this case, the width of the fifth hole HL5 in the first direction X may be the fifth width W5. The seventh trench TR7 may have the seventh length L7 and the seventh width W7. Further, the seventh trench TR7 may include a seventh hole HL7 in the top surface of the first interlayer insulating layer 120. In this case, the width of the seventh hole HL7 in the first direction X may be the seventh width W7. The ninth trench TR9 may have the ninth length L9 and the ninth width W9. Further, the ninth trench TR9 may include a ninth hole HL9 in the top surface of the first interlayer insulating layer 120. In this case, the width of the ninth hole HL9 in the first direction X may be the ninth width W9.

Here, by the low temperature etching process, the first width W1 may be greater than the third width W3 and the fifth width W5, and the first length L1 may be greater than the third length L3 and the fifth length L5. There may be an effect on etch profiles based, for example, on loading behavior and/or neighborhoods, that may be exacerbated at lower temperature etching processes.

Referring to FIG. 14, after the first to ninth channel structures CS1 to CS9 are formed, recesses may be formed through the first word line cut region WLC1 and the second word line cut region WLC2. In this case, the recesses may be formed by removing the sacrificial layer SL from the memory cell array MCA. Further, the recesses may be formed by removing the mold structure MS that corresponds to the first and second word line cut regions WLC1 and WLC2.

Referring to FIG. 15, as the recesses formed in FIG. 14 are filled, the ground select line GSL, the plurality of word lines WL1 to WLn, and the string select line SSL may be formed. Further, the common source lines CSL may be filled in the first and second word line cut regions WLC1 and WLC2.

Hereinafter, a memory cell array MCA' according some example embodiments will be described with reference to FIGS. 16 and 17.

Figure 16:
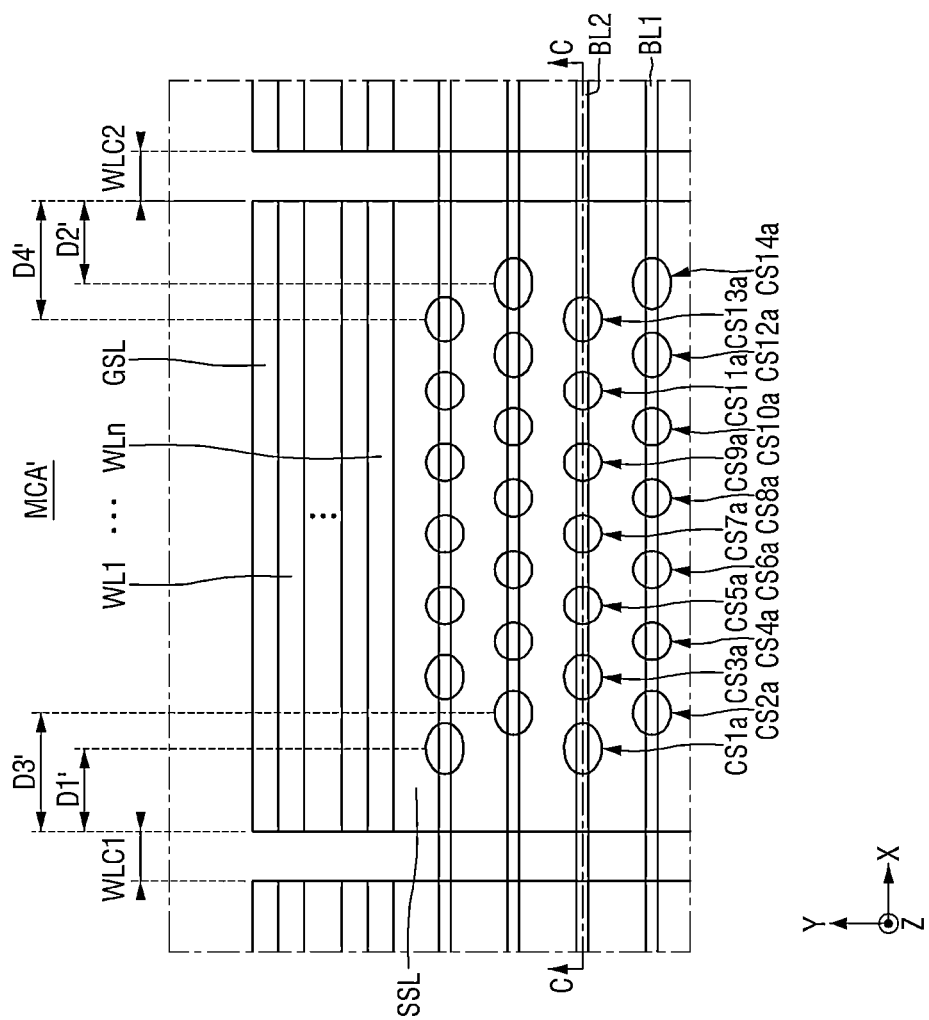
FIG. 16 is a top view of a memory cell array according to some example embodiments.

FIG. 16 is a top view of a memory cell array according to some example embodiments. FIG. 17 is an example cross-sectional view taken along line C-C of FIG. 16. For simplicity of description, redundant parts of the description made with reference to FIGS. 1 to 15 will be recapitulated or omitted.

Figure 17:
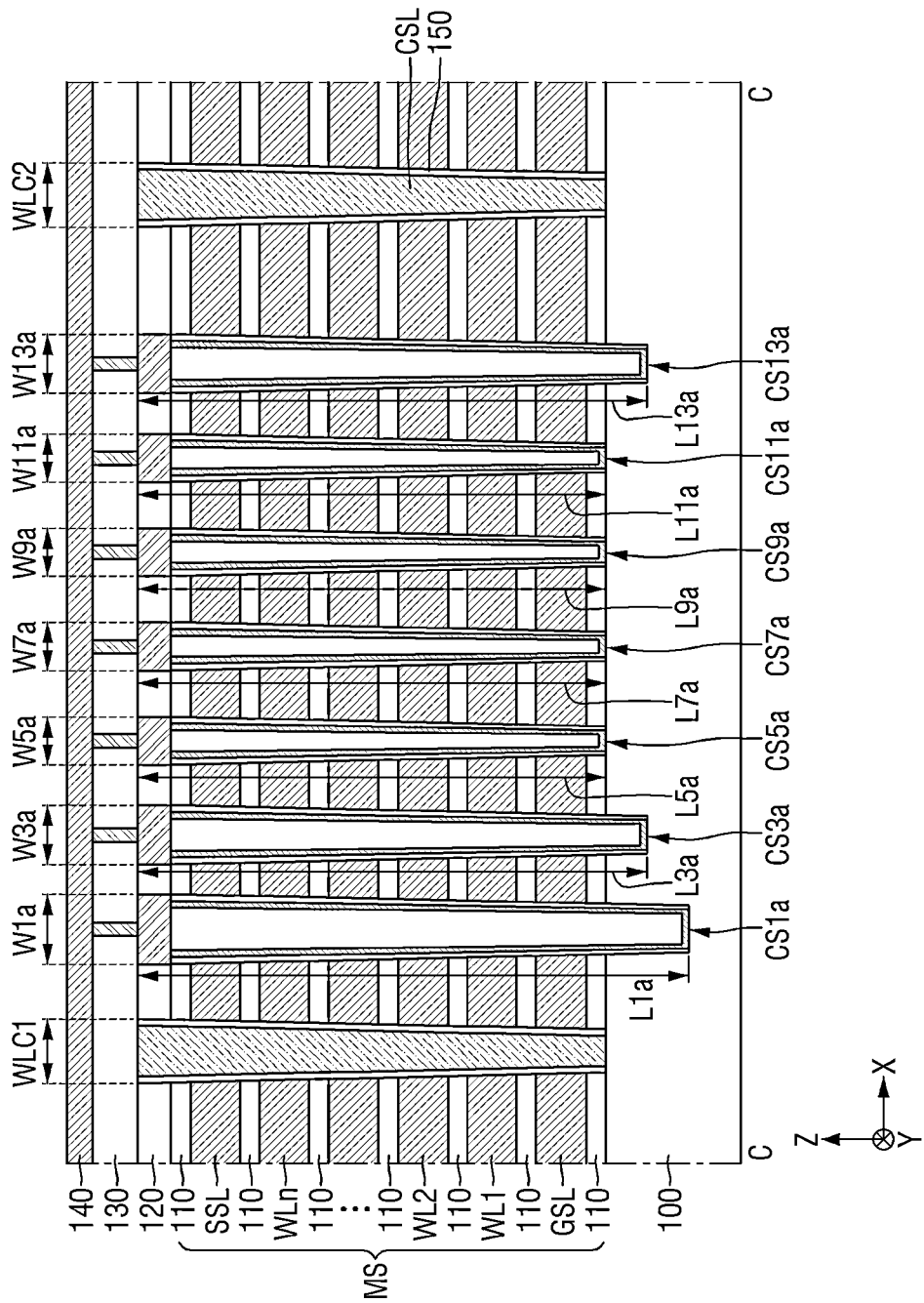
FIG. 17 is an example cross-sectional view taken along line C-C of FIG. 16.

Referring to FIGS. 16 and 17, a memory cell array MCA' may include a number of channel structures such as 14 channel structures CS1a to CS14a. The memory cell array MCA' may have 14 holes; however, example embodiments are not limited thereto. The 14 channel structures CS1a to CS14a may be arranged in zigzags.

The first to fourteenth channel structures CS1a to CS14a may be disposed between the first and second word line cut regions WLC1 and WLC2. The first channel structure CS1a, third channel structure CS3a, fifth channel structure CS5a, seventh channel structure CS7a, ninth channel structure CS9a, eleventh channel structure CS11a, and thirteenth channel structure CS13a may be arranged in a row in the first direction X, and all may be connected to the second bit line BL2. The second channel structure CS2a, fourth channel structure CS4a, sixth channel structure CS6a, eighth channel structure CS8a, tenth channel structure CS10a, twelfth channel structure CS12a, and fourteenth channel structures CS14a may be arranged in a row in the first direction X, and all may be connected to the first bit line BL1.

A third distance D3' from the first word line cut region WLC1 to the second channel structure CS2a may be greater than a first distance D1' from the first word line cut region WLC1 to the first channel structure CS1a. A fourth distance D4' from the second word line cut region WLC2 to the thirteenth channel structure CS13a may be greater than a second distance D2' from the second word line cut region WLC2 to the fourteenth channel structure CS14a. In this case, the first distance D1' may be the same as the second distance D2', and the third distance D3' may be the same as the fourth distance D4'. Further, the fourth distance D4' may be greater than the first distance D1', and the third distance D3' may be greater than the second distance D2'.

A first length L1a of the first channel structure CS1a may be greater than a third length L3a of the third channel structure CS3a, a fifth length L5a of the fifth channel structure CS5a, a seventh length L7a of the seventh channel structure CS7a, a ninth length L9a of the ninth channel structure CS9a, an eleventh length L11a of the eleventh channel structure CS11a, and a thirteenth length L13a of the thirteenth channel structure CS13a. Further, the third length L3a may be the same as the thirteenth length L13a. The length of the first channel structure CS1a, which is a channel structure relatively close to the first word line cut region WLC1, may be greater than the lengths of other channel structures. The length of the first channel structure CS1a, which is spaced apart from the first word line cut region WLC1 by the first distance D1', may be greater than the length of the thirteenth channel structure CS13a which is spaced apart from the second word line cut region WLC2 by the fourth distance D4'.

A first width W1a of the first channel structure CS1a may be greater than a third width W3a of the third channel structure CS3a, a fifth width W5a of the fifth channel structure CS5a, a seventh width W7a of the seventh channel structure CS7a, a ninth width W9a of the ninth channel structure CS9a, an eleventh width W11a of the eleventh channel structure CS11a, and a thirteenth width W13a of the thirteenth channel structure CS13a. Further, the third width W3a may be the same as the thirteenth width W13a. That is, the width of the first channel structure CS1a, which is the channel structure relatively close to the first word line cut region WLC1, may be greater than the widths of other channel structures. The width of the first channel structure CS1a, which is spaced apart from the first word line cut region WLC1 by the first distance D1', may be greater than the width of the thirteenth channel structure CS13a which is spaced apart from the second word line cut region WLC2 by the fourth distance D4'.

When the first distance D1' from the first word line cut region WLC1 and the fourth distance D4' from the second word line cut region WLC2 are different from each other, the first width W1a of the first channel structure CS1a may be different from the thirteenth width W13a of the thirteenth channel structure CS13a, and the first length L1a of the first channel structure CS1a may be different from the thirteenth length L13a of the thirteenth channel structure CS13a.

Hereinafter, a nonvolatile memory NVM' according to still another embodiment will be described with reference to FIG. 18.

Figure 18:
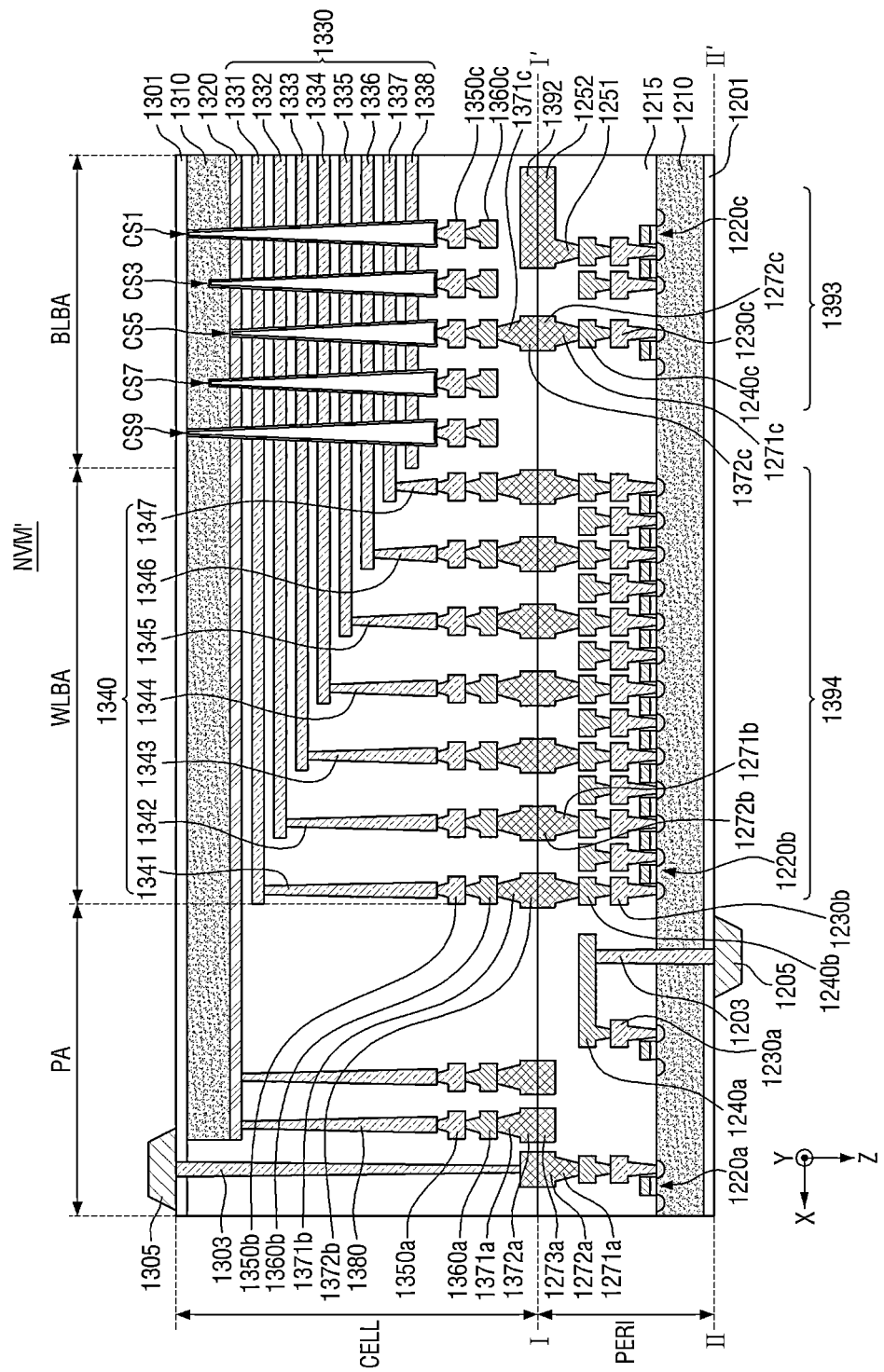
FIG. 18 is an example cross-sectional view of a nonvolatile memory according to some example embodiments.

FIG. 18 is an example cross-sectional view of a nonvolatile memory according to some example embodiments. For simplicity of description, redundant parts of the description made with reference to FIGS. 1 to 17 will be recapitulated or omitted.

Referring to FIG. 18, a nonvolatile memory NVM' according to some example embodiments may have a chip to chip (C2C) structure. In this drawing, a cell area CELL of the nonvolatile memory NVM' may correspond to the memory cell array MCA and the memory cell array MCA' of FIGS. 1 to 17.

The C2C structure may mean a structure obtained by manufacturing/fabricating an upper chip including a cell region CELL on a first substrate or first wafer, manufacturing/fabricating a lower chip including a peripheral circuit region PERI on a second substrate/second wafer different from the first wafer, and connecting the upper chip and the lower chip to each other by a bonding method. In some example embodiments, the bonding method may refer to a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

The peripheral circuit region PERI and the cell region CELL of the nonvolatile memory NVM' according to some example embodiments may each include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, a first metal layer 1230a, 1230b, and 1230c connected to each of the plurality of circuit elements 1220a, 1220b, and 1220c, and a second metal layer 1240a, 1240b, and 1240c formed on the first metal layer 1230a, 1230b, and 1230c. In one embodiment, the first metal layer 1230a, 1230b, and 1230c may be formed of tungsten having a relatively high resistance, and the second metal layer 1240a, 1240b, and 1240c may be formed of copper having a relatively low resistance.

In some example embodiments, only the first metal layer 1230a, 1230b, and 1230c and the second metal layer 1240a, 1240b, and 1240c are illustrated and described, but inventive concepts are not limited thereto, and one or more metal layers may be further formed on the second metal layer 1240a, 1240b, and 1240c. At least some of the one or more metal layers formed on the second metal layer 1240a, 1240b, and 1240c may be formed of aluminum and/or the like having a lower resistance than copper forming the second metal layer 1240a, 1240b, and 1240c.

The interlayer insulating layer 1215 may be disposed on the first substrate 1210 to cover the plurality of circuit elements 1220a, 1220b, and 1220c, the first metal layer 1230a, 1230b, and 1230c, and the second metal layer 1240a, 1240b, and 1240c, and may include an insulating material such as silicon oxide and/or silicon nitride.

Lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to upper bonding metals 1371b and 1372b of the cell region CELL by a bonding method. The lower bonding metals 1271b and 1272b and the upper bonding metals 1371b and 1372b may be formed of at least one of aluminum, copper, tungsten, or the like.

The cell region CELL may provide at least one memory block. The cell region CELL may include a second substrate 1310 and a common source line 1320. In this case, the second substrate 1310 may correspond to the substrate 100, and the common source line 1320 may correspond to the common source line CSL.

On the second substrate 1310, a plurality of word lines 1330 (1331 to 1338, corresponding to WL1 to WLn) may be stacked along the third direction z perpendicular to the top surface of the second substrate 1310. String select lines and a ground select line may be disposed above and below the word lines 1330, respectively, and the plurality of word lines 1330 may be disposed between the string select lines and the ground select line.

In the bit line bonding area BLBA, the plurality of channel structures CS1, CS3, CS5, CS7, and CS9 may extend in a direction perpendicular to the top surface of the second substrate 1310 and penetrate the word lines 1330, the string select lines, and the ground select line. The plurality of channel structures CS1, CS3, CS5, CS7, and CS9 may include one or more of a data storage layer, a channel layer, a buried insulating layer, and the like. The channel layer may be electrically connected to a first metal layer 1350*c* and a second metal layer 1360*c*. For example, the first metal layer 1350*c* may be a bit line contact, and the second metal layer 1360*c* may be the bit line 140 of FIG. 6. In some example embodiments, the bit line 1360*c* may extend along the second direction y parallel to the top surface of the second substrate 1310.

Here, the plurality of channel structures CS1, CS3, CS5, CS7, and CS9 may correspond to the plurality of channel structures of the memory cell array MCA described with reference to FIGS. 1 to 17. The lengths and widths of the channel structures CS1, CS3, CS5, CS7 and CS9 may all be different from each other.

An area, in which the plurality of channel structures CS1, CS3, CS5, CS7 and CS9, the bit line 1360*c*, and the like are disposed, may be defined as the bit line bonding area BLBA. In the bit line bonding area BLBA, the bit line 1360*c* may be electrically connected to the circuit elements 1220*c* that provide a page buffer 1393 in the peripheral circuit region PERI. In some example embodiments, the bit line 1360*c* may be connected to an upper bonding metal 1371*c* and 1372*c* in the peripheral circuit region PERI, and the upper bonding metal 1371*c* and 1372*c* may be connected to a lower bonding metal 1271*c* and 1272*c* connected to the circuit elements 1220*c* of the page buffer 1393.

In the word line bonding area WLBA, the word lines 1330 may extend along the first direction x parallel to the top surface of the second substrate 1310, and may be connected to a plurality of cell contact plugs 1340 (1341 to 1347). The word lines 1330 and the cell contact plugs 1340 may be connected to each other in pads provided by at least some of the word lines 1330 extending with different lengths along the first direction x. A first metal layer 1350*b* and a second metal layer 1360*b* may be sequentially connected to the top portions of the cell contact plugs 1340 connected to the word lines 1330. In the word line bonding area WLBA, the cell contact plugs 1340 may be connected to the peripheral circuit region PERI through the upper bonding metals 1371*b* and 1372*b* of the cell region CELL and the lower bonding metals 1271*b* and 1272*b* of the peripheral circuit region PERI.

The cell contact plugs 1340 may be electrically connected to the circuit elements 1220*b* that provide a row decoder 1394 in the peripheral circuit region PERI. In one embodiment, the operating voltage of the circuit elements 1220*b* providing the row decoder 1394 may be different from the operating voltage of the circuit elements 1220*c* providing the page buffer 1393. In some example embodiments, the operating voltage of the circuit elements 1220*c* providing the page buffer 1393 may be greater than the operating voltage of the circuit elements 1220*b* providing the row decoder 1394.

A common source line contact plug 1380 may be disposed in the external pad bonding area PA. The common source line contact plug 1380 may be formed of a conductive material such as at least one of a metal, a metal compound, or polysilicon such as doped polysilicon, and may be electrically connected to the common source line 1320. A first metal layer 1350*a* and a second metal layer 1360*a* may be sequentially stacked on the common source line contact plug 1380. As one example, an area in which the common source line contact plug 1380, the first metal layer 1350*a*, and the second metal layer 1360*a* are disposed may be defined as the external pad bonding area PA.

Meanwhile, input/output pads 1205 and 1305 may be disposed in the external pad bonding area PA. Below the first substrate 1210, a lower insulating layer 1201 may be formed to cover the bottom surface of the first substrate 1210, and a first input/output pad 1205 may be formed on the lower insulating layer 1201. The first input/output pad 1205 may be connected to at least one of the plurality of circuit elements 1220*a*, 1220*b*, and 1220*c* disposed in the peripheral circuit region PERI through a first input/output contact plug 1203, and may be separated from the first substrate 1210 by the lower insulating layer 1201. In addition, a side insulating layer may be disposed between the first input/output contact plug 1203 and the first substrate 1210 to electrically separate the first input/output contact plug 1203 from the first substrate 1210.

An upper insulating layer 1301 may be formed on the second substrate 1310 to cover the top surface of the second substrate 1310, and a second input/output pad 1305 may be disposed on the upper insulating layer 1301. The second input/output pad 1305 may be connected to at least one of the plurality of circuit elements 1220*a*, 1220*b*, and 1220*c* disposed in the peripheral circuit region PERI through a second input/output contact plug 1303.

According to some example embodiments, the second substrate 1310, the common source line 1320, and the like may not be disposed in an area where the second input/output contact plug 1303 is disposed. In addition, the second input/output pad 1305 may not overlap the word lines 1330 in the third direction z. The second input/output contact plug 1303 may be separated from the second substrate 1310 in a direction parallel to the top surface of the second substrate 1310, and may penetrate an interlayer insulating layer of the cell region CELL to be connected to the second input/output pad 1305.

According to some example embodiments, the first input/output pad 1205 and the second input/output pad 1305 may be selectively formed. For example, the nonvolatile memory NVM' according to some example embodiments may include only the first input/output pad 1205 disposed below the first substrate 1210, or only the second input/output pad 1305 disposed above the second substrate 1310. Alternatively, the nonvolatile memory NVM' may include both the first input/output pad 1205 and the second input/output pad 1305.

In each of the external pad bonding area PA and the bit line bonding area BLBA included in each of the cell region CELL and the peripheral circuit region PERI, an uppermost metal layer may have a metal pattern existing as a dummy pattern, or may be empty.

In the external pad bonding area PA of the nonvolatile memory NVM' according to some example embodiments, corresponding to an upper metal pattern 1372a formed on an uppermost metal layer of the cell region CELL, a lower metal pattern 1273a having the same shape as the upper metal pattern 1372a of the cell region CELL may be formed in an uppermost metal layer of the peripheral circuit region PERI. The lower metal pattern 1273a formed on the uppermost metal layer of the peripheral circuit region PERI may not be connected to a separate contact in the peripheral circuit region PERI. Similarly, in the external pad bonding area PA, corresponding to the lower metal pattern formed in the uppermost metal layer of the peripheral circuit region PERI, the upper metal pattern having the same shape as the lower metal pattern of the peripheral circuit region PERI may be formed in the upper metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a bonding method.

In addition, in the bit line bonding area BLBA, corresponding to a lower metal pattern 1252 formed in the uppermost metal layer of the peripheral circuit region PERI, an upper metal pattern 1392 having the same shape as the lower metal pattern 1252 of the peripheral circuit region PERI may be formed in the uppermost metal layer of the cell region CELL. A contact may not be formed on the upper metal pattern 1392 formed in the uppermost metal layer of the cell region CELL.

Hereinafter, an electronic system 2000 according to still another embodiment will be described with reference to FIGS. 19 to 23.

Figure 19:
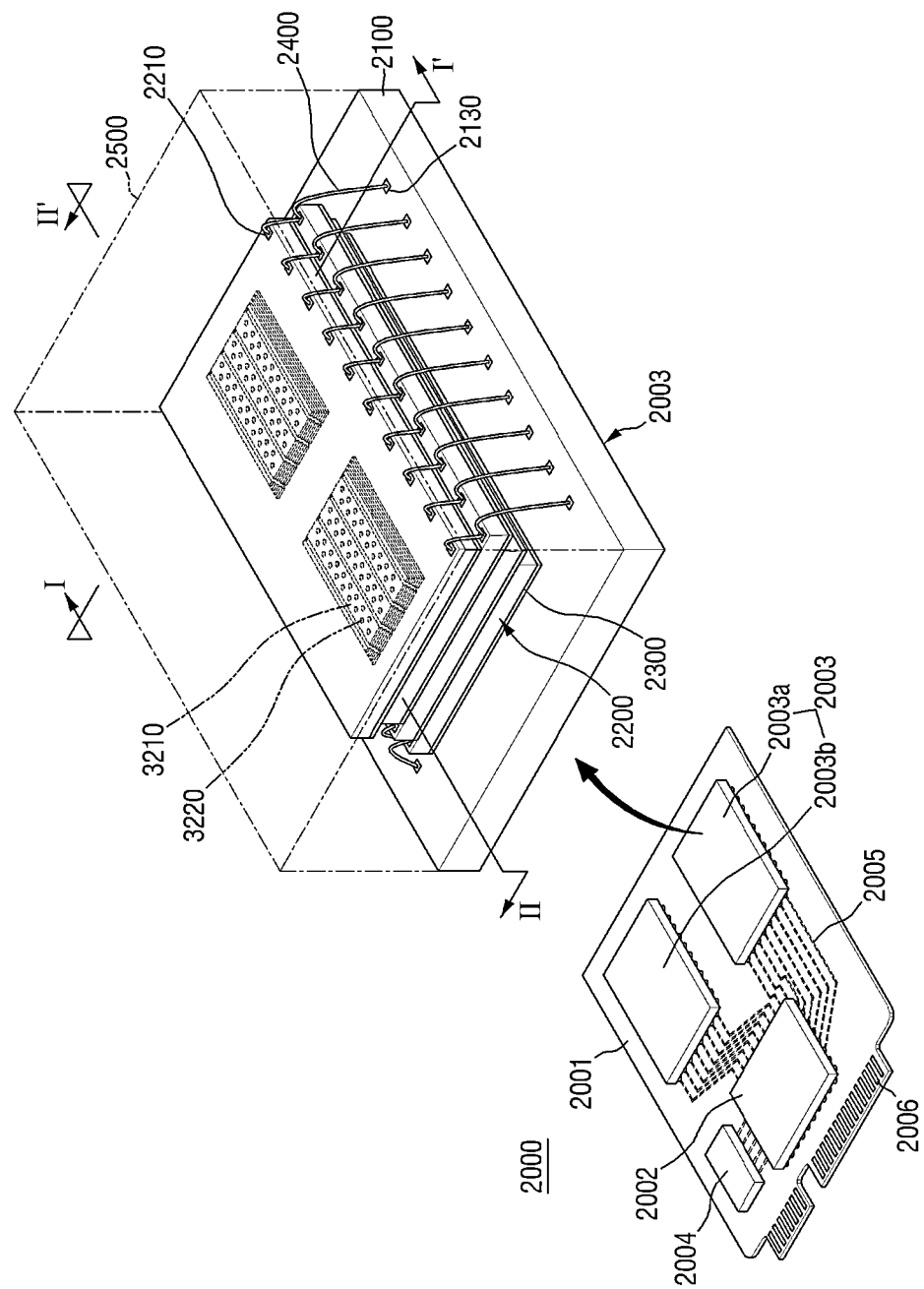
FIG. 19 is an example perspective view of a nonvolatile memory system according to some example embodiments.

FIG. 19 is an example perspective view of a nonvolatile memory system according to some example embodiments. For simplicity of description, redundant parts of the description made with reference to FIGS. 1 to 18 may be recapitulated or omitted.

Referring to FIG. 19, the electronic system 2000 according to an example embodiment of inventive concepts may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 having a plurality of pins connected to the external host. In the connector 2006, the number and/or arrangement of the pins may vary depending on a communication interface between the electronic system 2000 and the external host. In example embodiments, the electronic system 2000 may communicate with the external host through one or more interfaces such as universal serial bus (USB), peripheral component interconnect express (PCI-Express), serial advanced technology attachment (SATA), M-Phy for universal flash storage (UFS), and the like. In some example embodiments, the electronic system 2000 may operate by a power supplied from the external host through the connector 2006. The electronic system 2000 may further include a power management integrated circuit (PMIC) that distributes the power supplied from the external host to the controller 2002 and the semiconductor package 2003.

The controller 2002 may write or read data to/from the semiconductor package 2003, and may improve the operation speed of the electronic system 2000.

The DRAM 2004 may be a buffer memory for reducing a speed difference between the external host and the semiconductor package 2003 as a data storage space. The DRAM 2004 included in the electronic system 2000 may also operate as a sort of cache memory, and may also provide a space for temporarily storing data in controlling the semiconductor package 2003. When the electronic system 2000 includes the DRAM 2004, the controller 2002 may include not only a NAND controller for controlling the semiconductor package 2003 but also a DRAM controller for controlling the DRAM 2004.

The semiconductor packages 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on the bottom surfaces of the semiconductor chips 2200, connection structures 2400 electrically connecting the semiconductor chips 2200 to the package substrate 2100, and a molding layer 2500 covering the semiconductor chips 2200 and the connection structures 2400 above the package substrate 2100.

The package substrate 2100 may be a printed circuit board including upper package pads 2130. Each of the semiconductor chips 2200 may include an input/output pad 2210. Each of the semiconductor chips 2200 may include gate stacked structures 3210 and memory channel structures 3220.

In some example embodiments, the connection structure 2400 may be a bonding wire that electrically connects the input/output pad 2210 to the upper package pads 2130. Accordingly, in each of the first and second semiconductor packages 2003a and 2003b, the semiconductor chips 2200 may be electrically connected to each other, and may be electrically connected to the upper package pads 2130 of the package substrate 2100, by a wire bonding method. According to embodiments, in each of the first and second semiconductor packages 2003a and 2003b, the semiconductor chips 2200 may be electrically connected to each other by a connection structure including a through silicon via (TSV) instead of or in addition to the wire bonding type connection structure 2400.

In some example embodiments, the controller 2002 and the semiconductor chips 2200 may be included in one package. In some example embodiments, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 20:
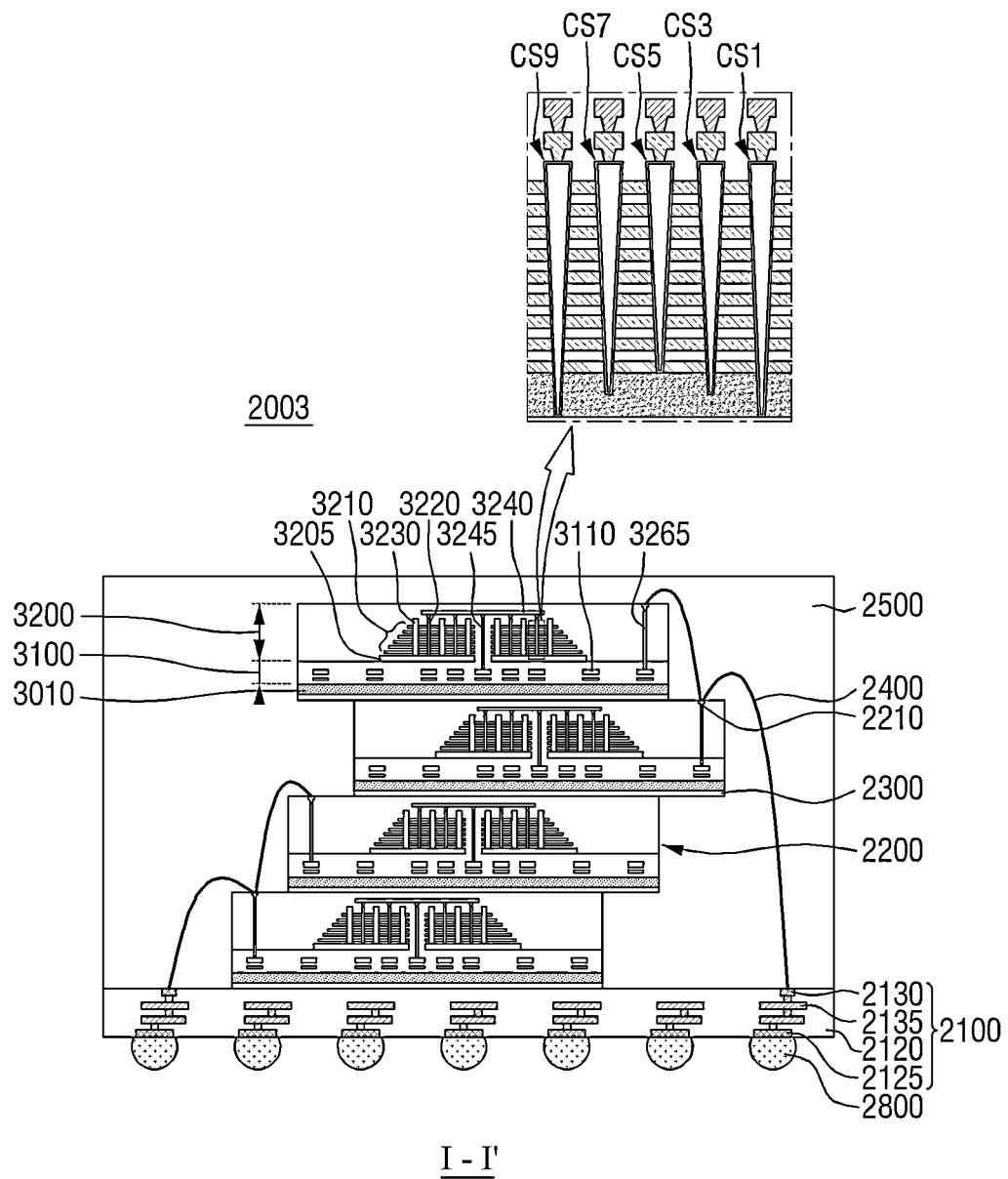
FIG. 20 is an example cross-sectional view of the nonvolatile memory package of FIG. 19 taken along line I-I'.
Figure 21:
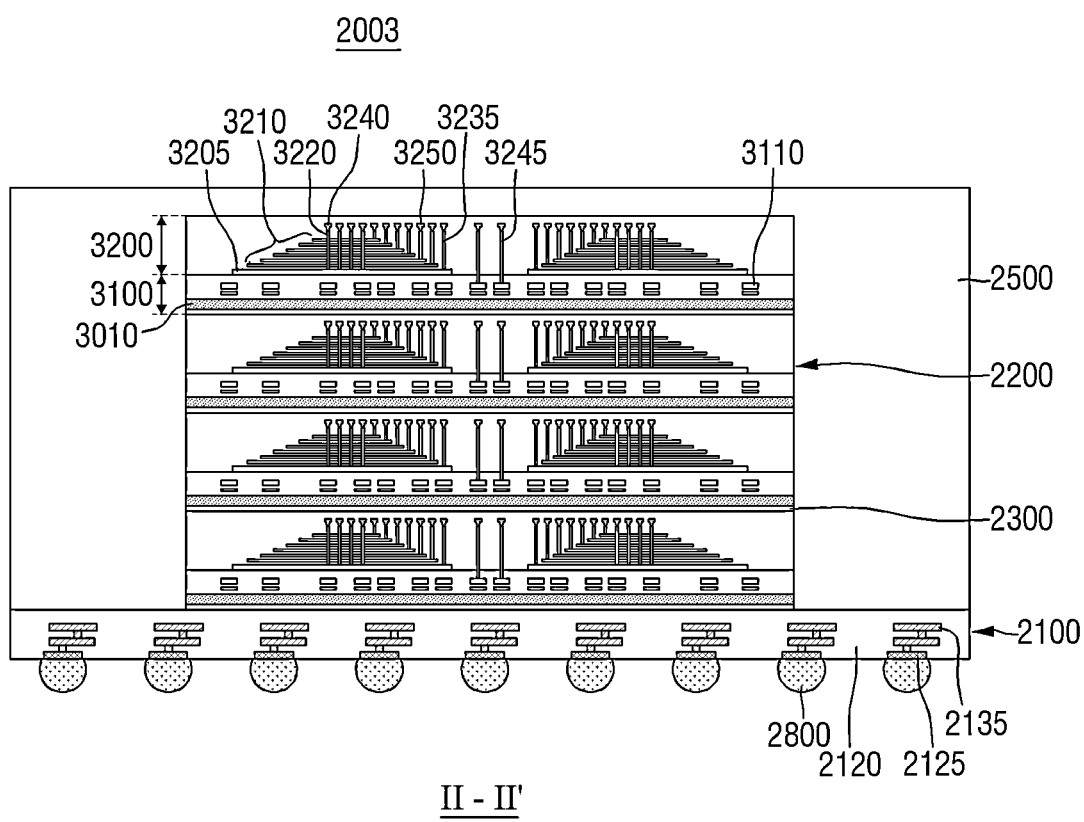
FIG. 21 is an example cross-sectional view of the nonvolatile memory package of FIG. 19 taken along line II-II'.

FIG. 20 is an example cross-sectional view of the nonvolatile memory package of FIG. 19 taken along line I-I'. FIG. 21 is an example cross-sectional view of the nonvolatile memory package of FIG. 19 taken along line II-II'.

Referring to FIGS. 20 and 21, the semiconductor package 2003 may have a cell over periphery (COP) structure. The semiconductor chip 2200 of the semiconductor package 2003 may be a semiconductor package having the COP structure described with reference to FIGS. 1 to 17.

In the semiconductor package 2003, the package substrate 2100 may be a printed circuit board. The package substrate 2100 may include a package substrate body portion 2120, the upper package pads 2130 disposed on the top surface of the package substrate body portion 2120, lower pads 2125 arranged on the bottom surface of the package substrate body portion 2120 or exposed through the bottom surface thereof, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2001 of the electronic system 2000 through conductive connectors 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, the gate stacked structure 3210 on the common source line 3205, the memory channel structures 3220 and isolation structures 3230 passing through the gate stacked structure 3210, bit lines 3240 electrically connected to the memory channel structures 3220, and gate connection wirings 3235 electrically connected to word lines of the gate stacked structure 3210. Each of the semiconductor chips 2200 may include a through wiring 3245 connected to the peripheral circuit region and an input/output connection wiring 3265 connected to the through wiring 3245. The input/output connection wiring 3265 may be connected to another input/output pad 2210 and the upper pad 2130 via the connection structure 2400.

Here, the gate stacked structure 3210, the memory channel structure 3220, and the isolation structure 3230 may correspond to the plurality of word lines WL1 to WLn, the first to ninth channel structures CS1 to CS9 and the first and second word line cut regions WLC1 and WLC2 of the memory cell array MCA described with reference to FIGS. 1 to 18. The lengths and widths of the first to ninth channel structures CS1 to CS9 may vary depending on distances from the first and second word line cut regions WLC1 and WLC2.

Figure 22:
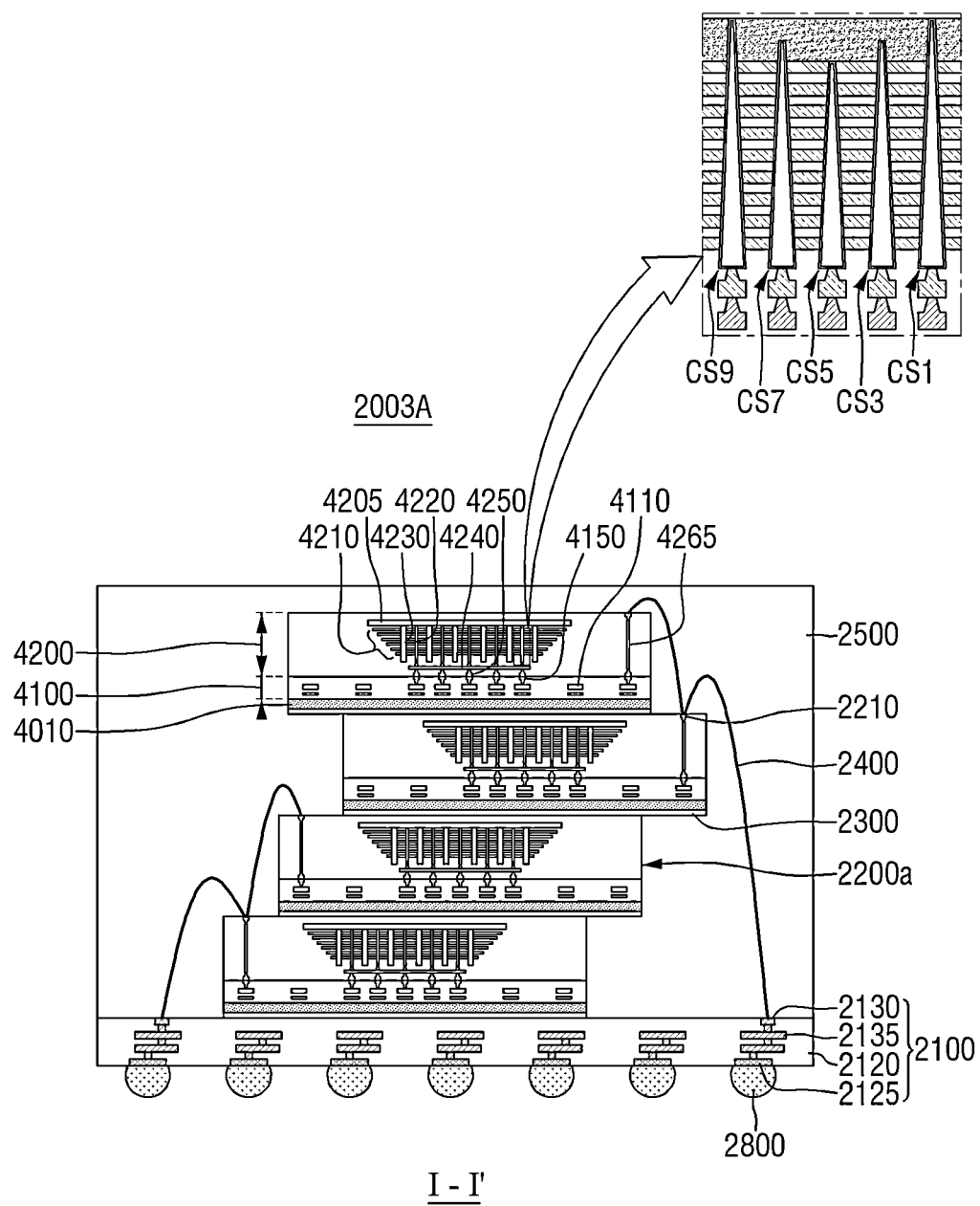
FIG. 22 is an example cross-sectional view of the nonvolatile memory package of FIG. 19 taken along line I-I'.
Figure 23:
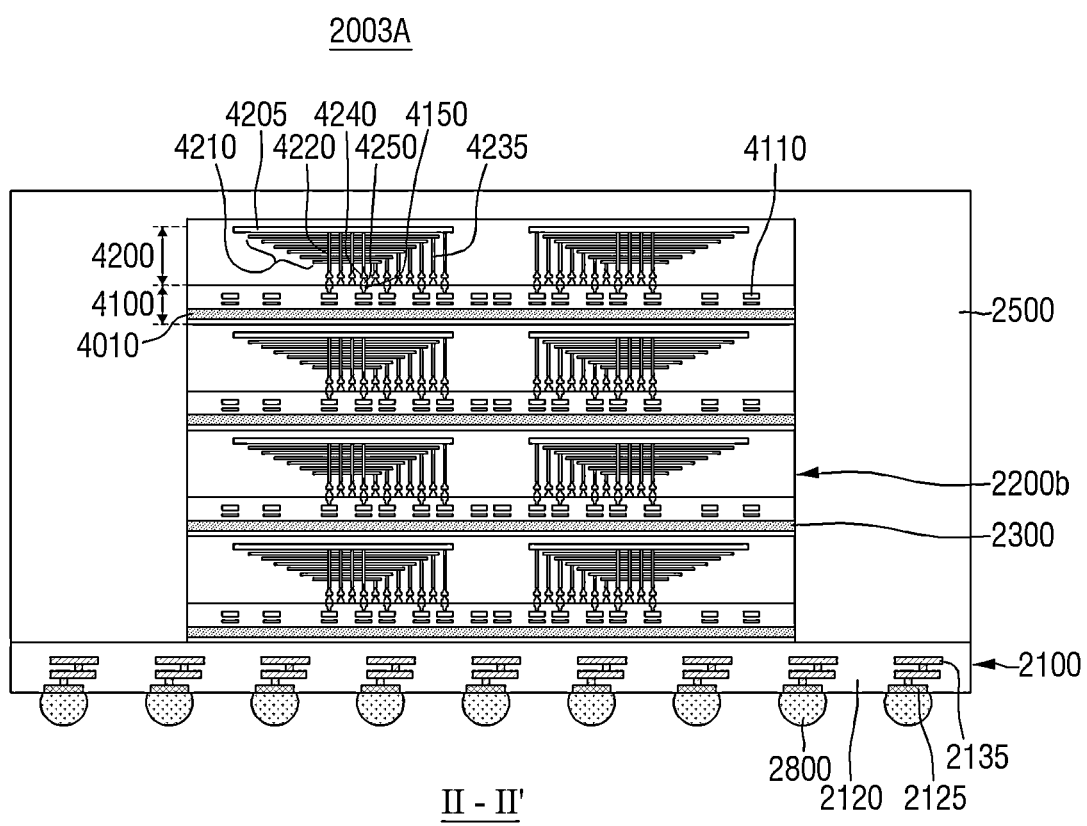
FIG. 23 is an example cross-sectional view of the nonvolatile memory package of FIG. 19 taken along line II-II'.

FIG. 22 is an example cross-sectional view of the nonvolatile memory package of FIG. 19 taken along line I-I'. FIG. 23 is an example cross-sectional view of the nonvolatile memory package of FIG. 19 taken along line II-II'.

Referring to FIGS. 22 and 23, in a semiconductor package 2003A, each of semiconductor chips 2200a may include a semiconductor substrate 4010, a first structure 4100 on the semiconductor substrate 4010, and a second structure 4200 bonded onto the first structure 4100 by a wafer bonding method.

The semiconductor package 2003A may have a chip-to-chip (C2C) structure. The semiconductor chip 2200a of the semiconductor package 2003A may include the nonvolatile memory NVM' having the C2C structure described with reference to FIG. 18.

The first structure 4100 may include a peripheral circuit region having a peripheral wiring 4110 and first bonding structures 4150. The second structure 4200 may include a common source line 4205, a gate stacked structure 4210 between the common source line 4205 and the first structure 4100, memory channel structures 4220 and an isolation structure 4230 passing through the gate stacked structure 4210, and second bonding structures 4250 electrically connected to the memory channel structures 4220 and word lines of the gate stacked structure 4210. For example, the second bonding structures 4250 may be electrically connected to the memory channel structures 4220 and the word lines via bit lines 4240, which are electrically connected to the memory channel structures 4220, and gate connection wirings 4235 which are electrically connected to the word lines. The first bonding structures 4150 of the first structure 4100 may be bonded to the second bonding structures 4250 of the second structure 4200 while being in contact therewith, respectively. Bonded parts of the first bonding structures 4150 and the second bonding structures 4250 may be formed of, for example, copper (Cu).

Each of the semiconductor chips 2200a may include an input/output connection wiring 4265 connected to the peripheral circuit region and the input/output pad 2210 connected to the input/output connection wiring 4265. The input/output pad 2210 may be connected to another input/output pad 2210 and the upper pad 2130 via the connection structure 2400.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In concluding the detailed description, those of ordinary skill in the art will appreciate that many variations and modifications can be made to the preferred embodiments without substantially departing from the principles of inventive concepts. Furthermore example embodiments are not necessarily mutually exclusive with one another. For example, some example embodiments may include features described with reference to one or more figures, and may also include other features described with reference to one or more other figures. Therefore, the disclosed example embodiments of inventive concepts are used in a generic and descriptive sense only and not for purposes of limitation.

What is claimed is:

1. A nonvolatile memory device comprising:
a substrate;
a mold structure including a plurality of word lines stacked on the substrate;
a first word line cut region cutting the mold structure;
a first channel structure apart from the first word line cut region by a first distance, and in the mold structure and the substrate; and
a second channel structure apart from the first word line cut region by a second distance, and in the mold structure and the substrate,
wherein the second distance is greater than the first distance,
a first width of the first channel structure is different from a second width of the second channel structure, and
a first length of the first channel structure is different from a second length of the second channel structure.

2. The nonvolatile memory device of claim 1, wherein the first width is greater than the second width.

3. The nonvolatile memory device of claim 1, wherein the first length is greater than the second length.

4. The nonvolatile memory device of claim 1, further comprising:

a third channel structure apart from the first word line cut region by a third distance greater than the first and second distances and in the mold structure and the substrate.

5. The nonvolatile memory device of claim 4, wherein a third width of the third channel structure is different from the first width and the second width, and
a third length of the third channel structure is different from the first length and the second length.

6. The nonvolatile memory device of claim 4, wherein a third width of the third channel structure is the same as the second width, and
a third length of the third channel structure is the same as the second length.

7. The nonvolatile memory device of claim 4, wherein a third width of the third channel structure is the same as the first width, and
a third length of the third channel structure is the same as the first length.

8. The nonvolatile memory device of claim 7, further comprising:
a fourth channel structure apart from the first word line cut region by a fourth distance greater than the third distance and in the mold structure and the substrate,
wherein a fourth width of the fourth channel structure is less than the third width, and
a fourth length of the fourth channel structure is less than the third length.

9. The nonvolatile memory device of claim 1, further comprising:
a second word line cut region apart from the first word line cut region and cutting the mold structure; and
a third channel structure apart from the second word line cut region by a third distance and in the mold structure and the substrate.

10. The nonvolatile memory device of claim 9, wherein the first distance is the same as the third distance,
a third width of the third channel structure is the same as the first width, and
a third length of the third channel structure is the same as the first length.

11. The nonvolatile memory device of claim 10, further comprising:
a first bit line connected to the first channel structure and a second bit line connected to the third channel structure,
wherein the first bit line and the second bit line are different from each other.

12. The nonvolatile memory device of claim 1, wherein the first channel structure and the second channel structure are arranged in a first direction from the first word line cut region,
the first and second widths are widths of the first and second channel structures in the first direction, and
the first and second lengths are lengths of the first and second channel structures in a second direction crossing the first direction.

13. The nonvolatile memory device of claim 12, wherein the first word line cut region cuts the mold structure in a third direction crossing the first and second directions.

14. A nonvolatile memory device comprising:
a substrate;
a mold structure including a plurality of word lines stacked on the substrate;
a first word line cut region cutting the mold structure;
a second word line cut region spaced apart from the first word line cut region in a first direction, and cutting the mold structure;
a first channel structure apart from the first word line cut region by a first distance and in the mold structure and the substrate; and
a second channel structure apart from the second word line cut region by a second distance greater than the first distance and in the mold structure and the substrate,
wherein a first width of the first channel structure is different from a second width of the second channel structure, and
a first length of the first channel structure is different from a second length of the second channel structure.

15. The nonvolatile memory device of claim 14, further comprising:
a third channel structure apart from the second word line cut region by the first distance and in the mold structure and the substrate,
wherein a third width of the third channel structure is the same as the first width, and
a third length of the third channel structure is the same as the first length.

16. The nonvolatile memory device of claim 15, further comprising:
a first bit line coupled to the first channel structure and the second channel structure; and
a second bit line apart from the first bit line in a second direction crossing the first direction and connected to the third channel structure,
wherein the first bit lines and the second bit lines are not contiguous with each other.

17. The nonvolatile memory device of claim 14, wherein a third distance from the first word line cut region to the second channel structure is greater than the second distance, and
a fourth distance from the second word line cut region to the first channel structure is greater than the first distance.

18. The nonvolatile memory device of claim 14, wherein the first width is greater than the second width, and the first length is greater than the second length.

19. A nonvolatile memory device comprising:
a substrate;
a mold structure including a plurality of word lines stacked on the substrate;
a first word line cut region cutting the mold structure;
a second word line cut region apart from the first word line cut region in a first direction and cutting the mold structure;
a first channel structure apart from the first word line cut region by a first distance and in the mold structure and the substrate;
a second channel structure spaced apart from the first word line cut region by a second distance greater than the first distance, and in the mold structure and the substrate; and
a third channel structure apart from the first word line cut region by a third distance greater than the second distance, and in the mold structure and the substrate,
wherein a first length of the first channel structure is different from a second length of the second channel structure and a third length of the third channel structure.

20. The nonvolatile memory device of claim 19, wherein the first to third channel structures are between the first and second word line cut regions.

\* \* \* \* \*